United States Patent
Isobe et al.

(10) Patent No.: US 7,760,549 B2
(45) Date of Patent: Jul. 20, 2010

(54) NONVOLATILE SEMICONDUCTOR MEMORY DEVICE

(75) Inventors: Katsuaki Isobe, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 12/204,409

(22) Filed: Sep. 4, 2008

(65) Prior Publication Data

US 2009/0067236 A1    Mar. 12, 2009

(30) Foreign Application Priority Data

Sep. 6, 2007  (JP) ............... 2007-231633

(51) Int. Cl.
  *G11C 16/04*  (2006.01)
(52) U.S. Cl. .............. 365/185.11; 365/185.17
(58) Field of Classification Search ............ 365/185.11, 365/185.17, 185.23
  See application file for complete search history.

(56) References Cited

U.S. PATENT DOCUMENTS 7,345,913 B2   3/2008  Isobe
7,411,824 B2   8/2008  Shibata et al.
2008/0019193 A1 * 1/2008 Li et al. ............... 365/189.07
2009/0059670 A1 * 3/2009 Maejima et al. ........ 365/185.18

FOREIGN PATENT DOCUMENTS

JP    11-96777      4/1999
JP    2001-236786   8/2001
JP    2006-172630   6/2006

OTHER PUBLICATIONS

U.S. Appl. No. 12/168,457, filed Jul. 7, 2008, Noboru Shibata et al.

* cited by examiner

*Primary Examiner*—Vu A Le
(74) *Attorney, Agent, or Firm*—Oblon, Spivak, McClelland, Maier & Neustadt, L.L.P.

(57) ABSTRACT

A memory device includes a control circuit which controls a semiconductor region, a first bit line, a second bit line and a source line. The control circuit is comprised of means for making the first bit line floating, after pre-charging the first bit line to a first potential, means for varying the first bit line from the first potential to a third potential by providing a second potential to the second bit line, the semiconductor region and the source line with the first bit line in the floating state, and means for reading data of the first cell transistor to the first bit line, after setting the first bit line to the third potential.

22 Claims, 20 Drawing Sheets

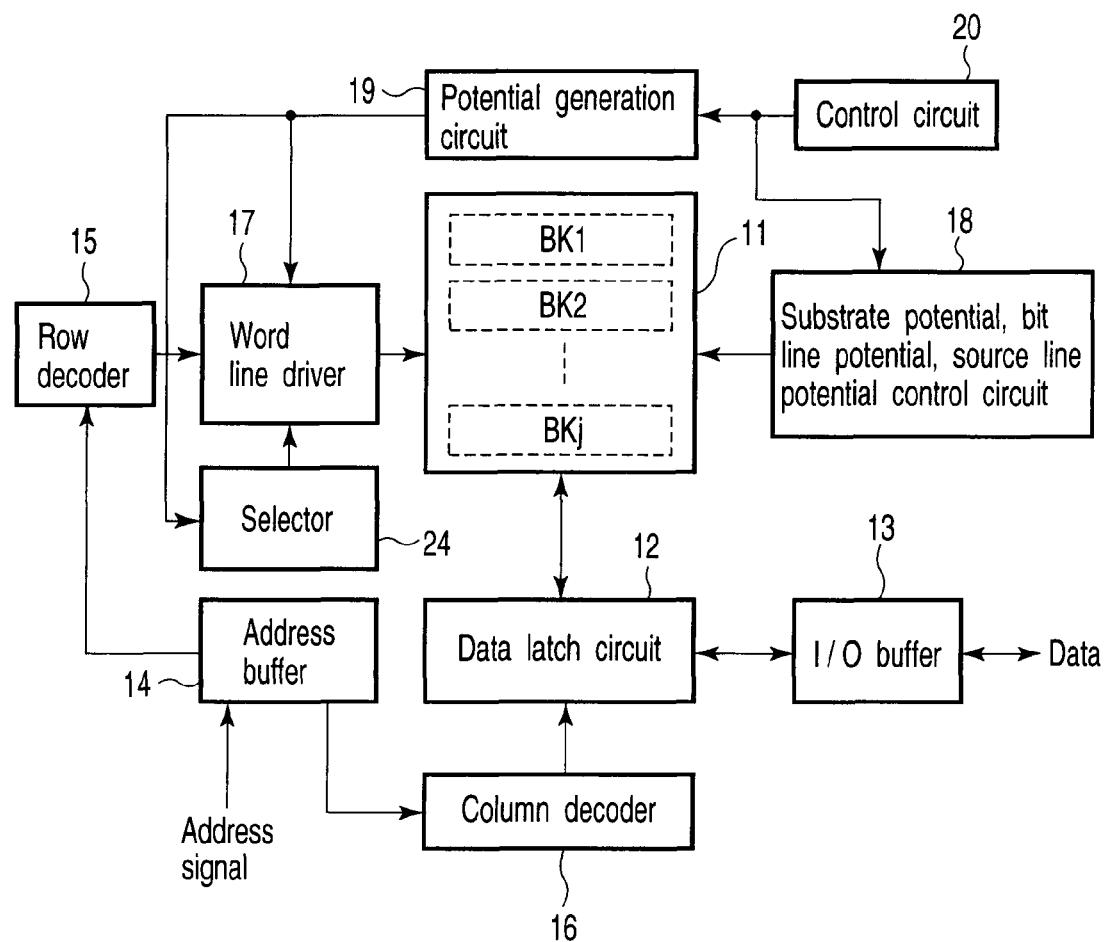
F I G. 1

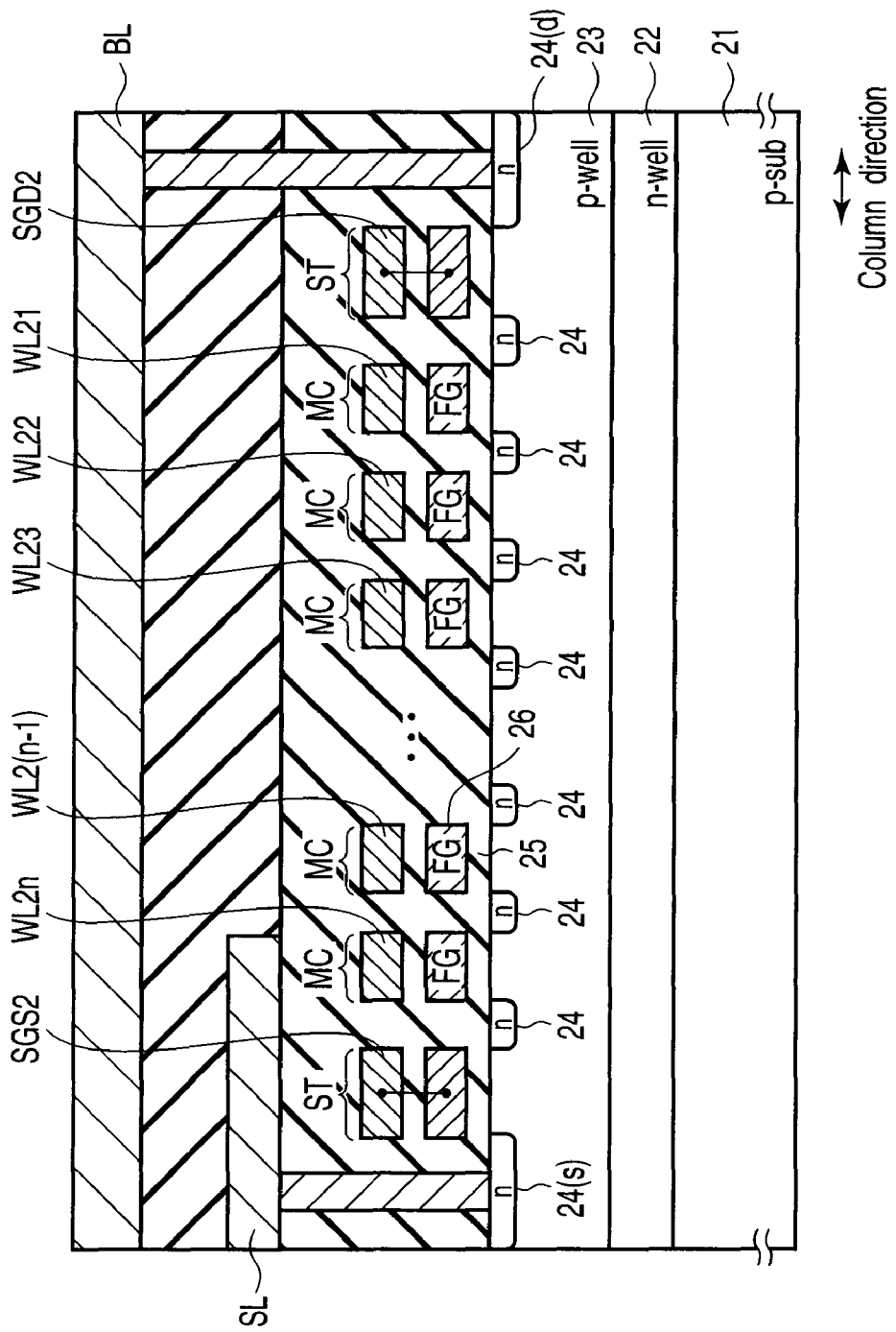
F I G. 4

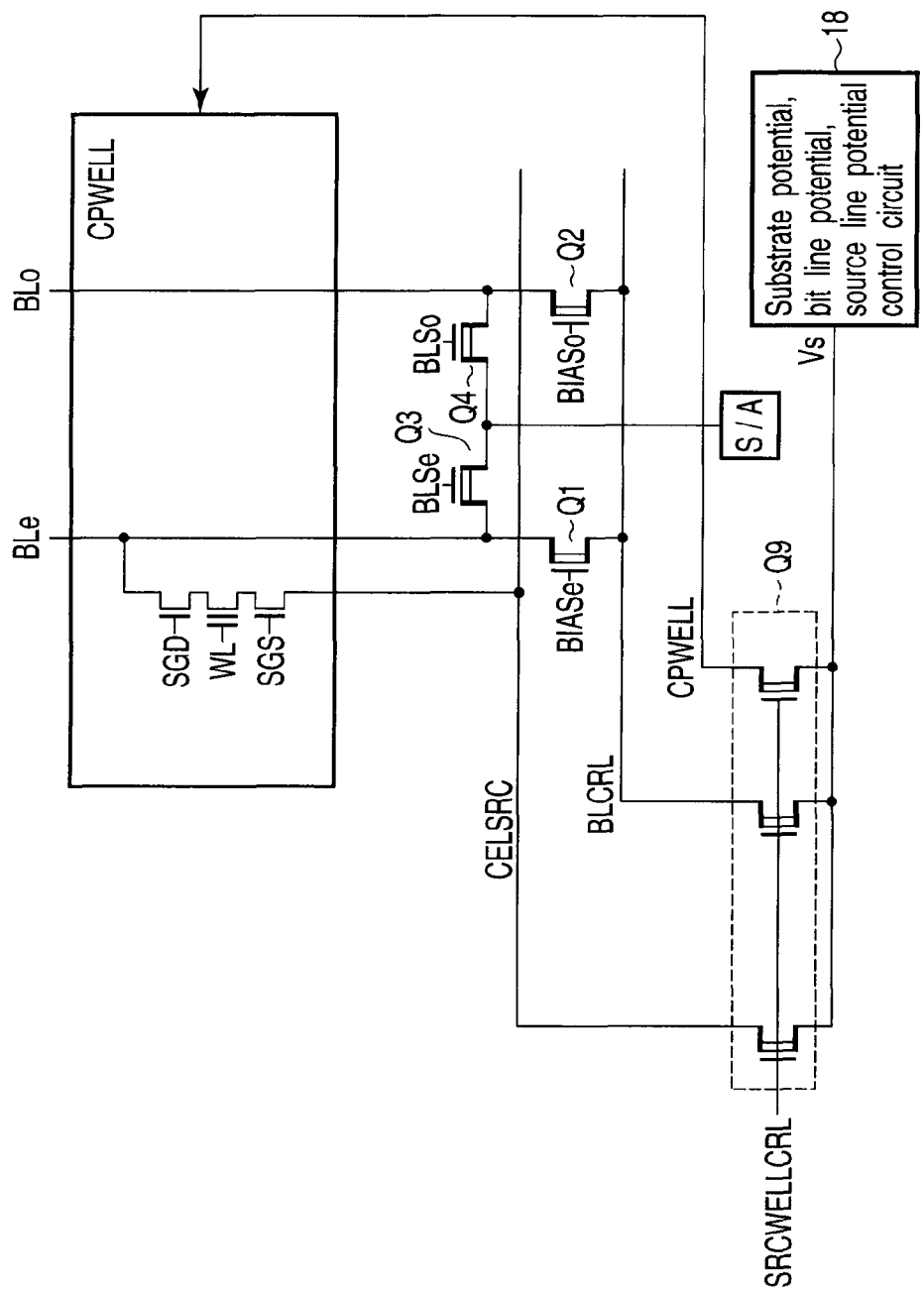
F I G. 8

Negative potential read system (shield bit line sense system)

Negative potential read system (shield bit line sense system)

NONVOLATILE SEMICONDUCTOR MEMORY DEVICE

CROSS-REFERENCE TO RELATED APPLICATIONS

This application is based upon and claims the benefit of priority from prior Japanese Patent Application No. 2007-231633, filed Sep. 6, 2007, the entire contents of which are incorporated herein by reference.

BACKGROUND OF THE INVENTION

1. Field of the Invention

The present invention relates to a system for a read (including a verify read) of a nonvolatile semiconductor memory device.

2. Description of the Related Art

In the nonvolatile semiconductor memory device represented by a NAND type flash memory, for instance, write is performed by entrapping electrons in a floating gate electrode or an insulating film as a charge storage layer with a high electric field exerted, followed by varying a threshold voltage of the memory cell.

Here, state of the memory cell after write is expressed with threshold distributions. That is, for a binary memory, two threshold distributions exist, while, for a multi-level memory which stores three levels or more in the memory cell, the threshold distributions exist by the number of values which are stored in the memory cell.

The multi-level memory has been attracting attention as a technique for achieving increase in a memory capacity without increasing cell size in a state that limitation of the cell size is indicated.

However, as the number of values stored in the memory cell increases, control to narrow the threshold distributions becomes necessary. In addition, an interval between the threshold distributions is narrowed and also retention margin is narrowed, so that characteristics relating to data retention of the memory cell deteriorate.

By increasing the write potential and the read potential, a range for arranging the plurality of threshold distributions becomes wide, however, it has a limitation. In addition, when increasing the write potential and the read potential, disturb occurs at the time of write and at the time of read, and this becomes the cause of write errors and read errors.

Meanwhile, it is general for arrangement of the threshold distributions to set one threshold distribution (erase state) to a negative region lower than 0V, and to set remaining plural threshold distributions (write states) to a positive region higher than 0V.

Consequently, instead of such general technique, investigated is a technique for widening the retention margin while arranging some of the plurality of threshold distributions with the write state at present to the negative region (for instance, refer to Jpn. Pat. Appln. KOKAI Publication No. 11-96777).

In order to realize this technique, development of a system for a read (including a verify read) is indispensable, for discriminating the plurality of threshold distributions existing in the negative region.

For instance, according to the read system providing negative potentials to word lines, it is possible to discriminate the plurality of threshold distributions existing in the negative region. However, in that case, since it becomes necessary for the device to modify configuration of the well in which the word line driver is formed, so as to be able to transfer the negative potential, process cost increases.

In addition, according to the read system providing a bias to bit lines, cell sources and cell wells, it is possible to discriminate the plurality of threshold distributions existing in the negative region without providing the negative potentials to the word lines (by using only positive potentials). However, when biasing bit lines to potentials more than the source potential, a separate booster applying a bias to bit lines becomes necessary, and therefore, chip areas increase by the corresponding amount.

BRIEF SUMMARY OF THE INVENTION

A nonvolatile semiconductor memory device according to an aspect of the present invention comprises a semiconductor region, first and second cell units formed in the semiconductor region, a first bit line connected to one end of the first cell unit, a second bit line connected to one end of the second cell unit, a source line connected to the other ends of the first and second cell units, and a control circuit which controls the semiconductor region, the first and second bit lines, and the source line. The first cell unit is comprised of a first cell transistor having a charge storage layer and a control gate electrode, a first select gate transistor connected between the first cell transistor and the first bit line, and a second select gate transistor connected between the first cell transistor and the source line, and the second cell unit is comprised of a second cell transistor having a charge storage layer and a control gate electrode, a third select gate transistor connected between the second cell transistor and the second bit line, and a fourth select gate transistor connected between the second cell transistor and the source line. The control circuit is comprised of first means for making the first bit line floating, after pre-charging the first bit line to a first potential, second means for varying the first bit line from the first potential to a third potential by providing a second potential to the second bit line, the semiconductor region and the source line with the first bit line in the floating state, and third means for reading data of the first cell transistor to the first bit line, after setting the first bit line to the third potential.

BRIEF DESCRIPTION OF THE SEVERAL VIEWS OF THE DRAWING

FIG. 1 is an overall view of a NAND type flash memory;

FIG. 4 is a cross sectional view of the NAND cell unit in a column direction;

FIG. 8 is a circuit diagram showing paths providing a bias to the cell well and the cell source;

DETAILED DESCRIPTION OF THE INVENTION

Figure 2:
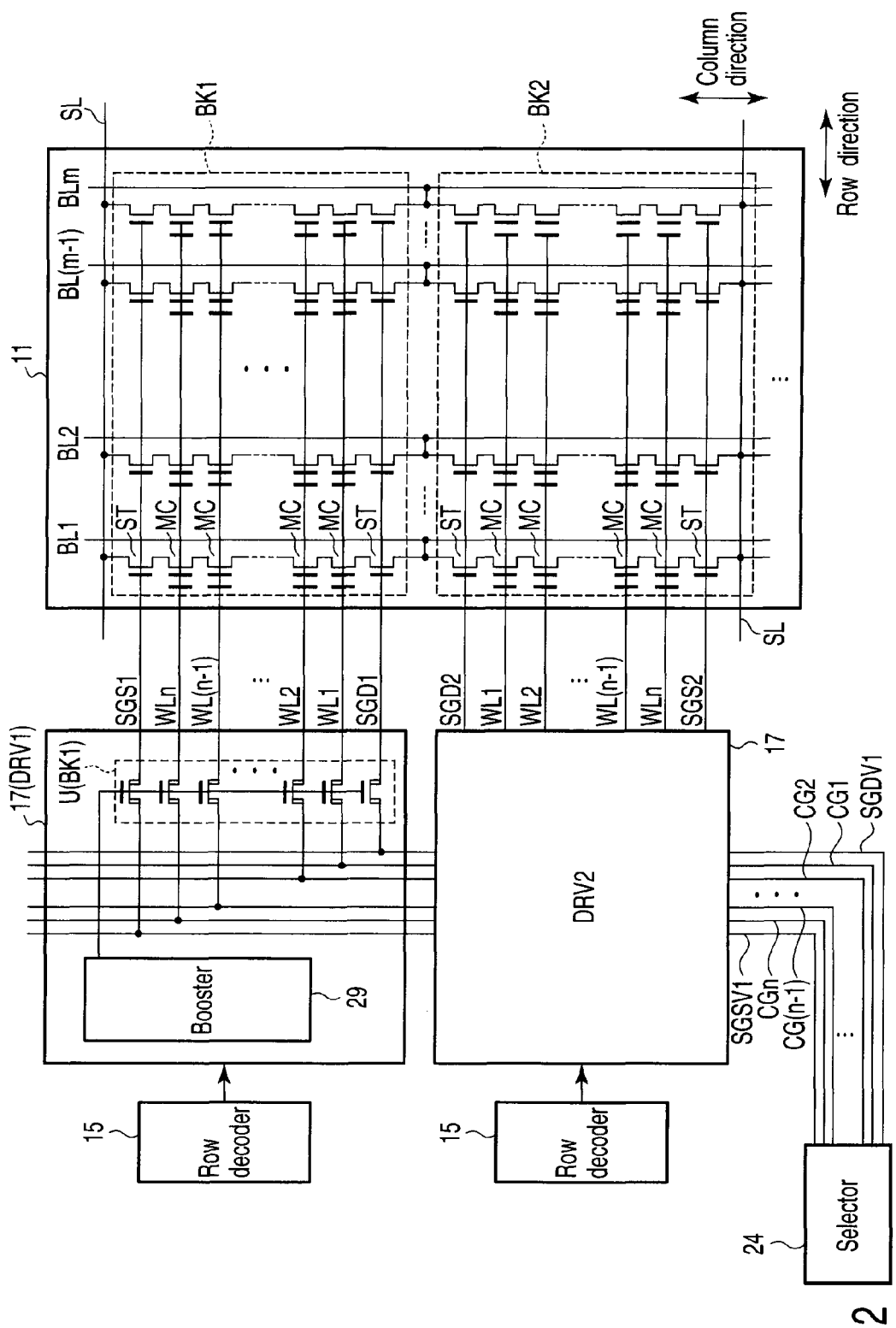
FIG. 2 is a circuit diagram showing a memory cell array and a driver.

A nonvolatile semiconductor memory device of an aspect of the present invention will be described below in detail with reference to the accompanying drawings.

1. Outline

The present invention relates to a negative potential read for discriminating threshold distributions existing on a negative region. In this system, in principle, discriminated is the state of a cell transistor (selection cell) while applying negative potentials to selection word lines.

Compared with this, when providing the bias to the bit line, the cell source and the cell well, it becomes possible to the negative potential read without providing the negative potential to the word line (by only positive potential). However, since the bit line is a large load, when providing the bias to the bit line by using a booster, it becomes necessary to provide the booster with large driving ability.

The present invention proposes a technology for providing the bias to the bit line for the negative potential read (reading using a potential equivalent to the negative potential), based on an operative technique utilizing a capacitance coupling generated on the bit line, even though there is no booster.

In addition, it is also possible to eliminate variation of bit line biases caused by utilizing only the capacitance coupling, while fixing the bias to a constant value by using the booster supplementarily.

Specifically, first, after pre-charging the selection bit line to the first potential, the selection bit line is made floating. Next, the selection bit line is changed from the first potential to the third potential by using the capacitance coupling by providing the second potential to a non-selection bit line, the cell well (semiconductor region) and the cell source (source line) with the selection bit line being in the floating state. In addition, it is also possible to set the selection bit line to the third potential by providing the second potential only to the non-selection bit line. After that, when reading the data of the cell transistor to the selection bit line while providing a positive read potential to the selection word line, it is possible to read by using the negative potential substantially.

In addition, when eliminating variations of the bit line bias, the data of the cell transistor is read, after setting the selection bit line to the fourth potential forcibly by using the booster.

In this manner, the system for read (including verify read) discriminating threshold distributions existing in the negative region is realized without modification of the device or increase in the chip area.

Since the present invention utilizes the capacitance coupling between the selection bit line and the non-selection bit line, the present invention is effective for a semiconductor memory to which Shield bit line sense system is applied. In addition, also in the semiconductor memory provided with an ABL (All Bit Line) sense circuit, it is possible to read by using the negative potential in the Shield bit line system, in which case it is possible to apply the present invention thereto.

2. Embodiments

There will be explained embodiments of the present invention with a NAND type flash memory as an example.

Hereinafter, although explanation will be made about the NAND type flash memory, the present invention is applicable to overall nonvolatile semiconductor memory device in which the threshold voltage of the memory cell is changed by entrapping electrons in a charge storage layer with a high electric field exerted.

(1) Overall Configuration

There will be explained the configuration of the NAND type flash memory to implement the present invention.

FIG. 1 shows an overall view of the NAND type flash memory.

A memory cell array 11 has a plurality of blocks BK1, BK2, . . . BKj. Each of the plurality of blocks BK1, BK2, . . . BKj has a NAND cell unit.

A data latch circuit 12 has a function to latch the data temporarily at the time of read/write, and for instance, the data latch circuit 12 is comprised by a flip-flop circuit. The data latch circuit 12 includes a sense amplifier.

An I/O (input/output) buffer 13 functions as a data interface circuit and an address buffer 14 functions as an address interface circuit.

Address signals include block address signals, row address signals and column address signals.

A row decoder 15 selects one of the plurality of blocks BK1, BK2, . . . BKj based on the block address signals, and selects one of the plurality of word lines in the selected block based on the row address signal. A word line driver 17 drives the plurality of word lines in the selected block.

A column decoder 16 selects one of the plurality of bit lines based on the column address signal.

A substrate potential/bit line potential/source line potential control circuit 18 controls the potential of the semiconductor substrate, the bit line and the source line.

Specifically, in a p-type semiconductor substrate, a double well region formed of an n-type well region and a p-type well region is formed, and when the memory cell is formed in the p-type well region, the control circuit 18 controls the potential of the p-type well region (cell well).

In addition, the control circuit 18 controls the bit line potential and the source line potential at the time of read (including verify read).

A potential generation circuit 19 generates potentials supplied to the plurality of word lines in the selected block, and for instance, at the time of read, generates a read potential applied to the selection word line and a transfer potential applied to the non-selection word line.

A selector 24 selects the potentials generated by the potential generation circuit 19 and supplies the selected potential to the word line driver 17.

A control circuit 20 controls operations of the substrate potential/bit line potential/source line potential control circuit 18 and the potential generation circuit 19.

FIG. 2 shows the memory cell array and the word line driver.

The memory cell array 11 has a plurality of blocks BK1, BK2, . . . arranged in the column direction. Each of the plurality of blocks BK1, BK2, . . . has a plurality of NAND cell units arranged in the row direction. The NAND cell unit has a NAND string formed of a plurality of memory cells MC connected in series, and two select gate transistors ST connected to both ends of the NAND string one by one.

Figure 3:
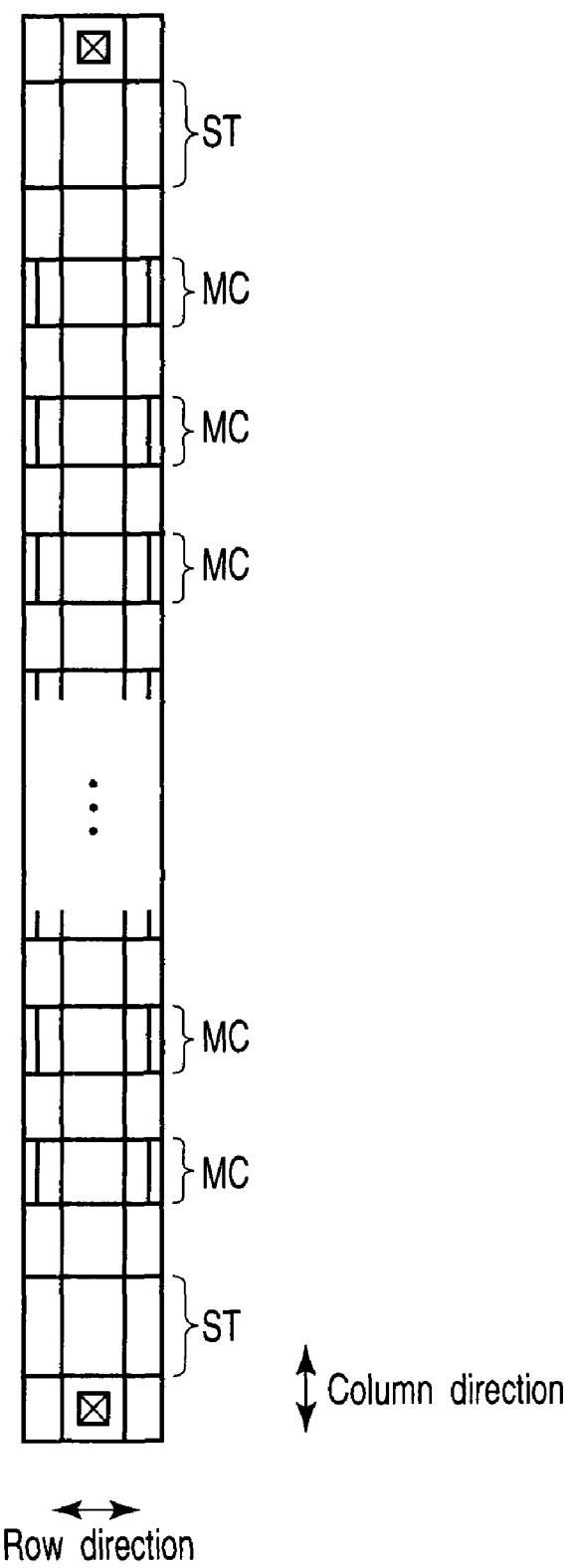
FIG. 3 is a plan view showing a NAND cell unit.

The NAND cell unit has, for instance, a layout as shown in FIG. 3. A cross sectional structure of the NAND cell unit in the column direction results in the one as shown in FIG. 4 or 5, for instance.

In the p-type semiconductor substrate 21, an n-type well region 22 and a p-type well region 23 are respectively formed. Then, the memory cell MC and the select gate transistor ST are formed in the p-type well region 23.

The memory cell MC of FIG. 4 has a floating gate electrode (FG) 26 and control gate electrodes (word lines) WL21, . . . WL2n on a channel region between diffusion layers 24. In this case, the select gate transistor ST has a lower electrode and an upper electrode.

Figure 5:
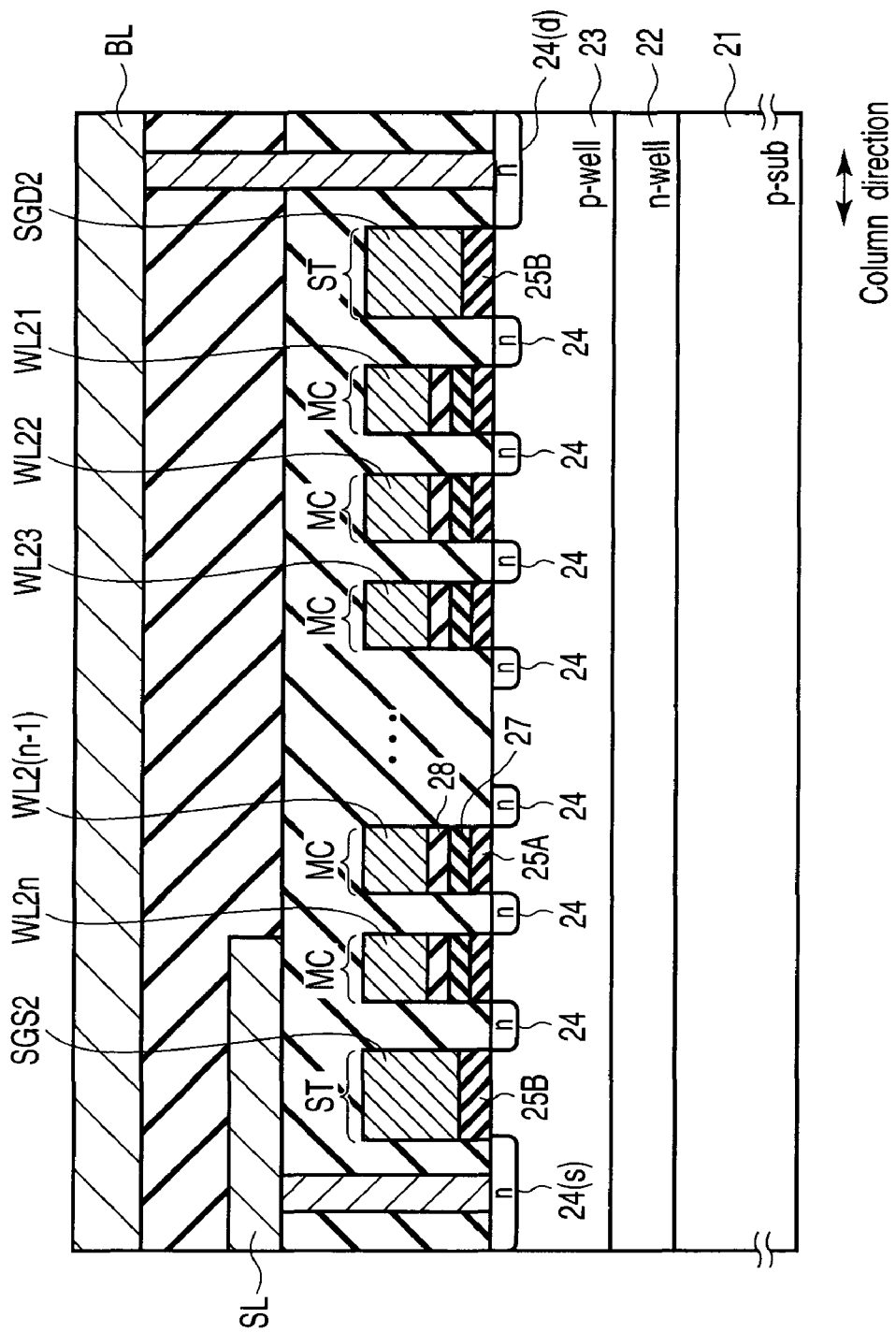
FIG. 5 is a cross sectional view of the NAND cell unit in a row direction.

The memory cell MC of FIG. 5 has MONOS structure in which the charge storage layer is comprised of an insulating film (for instance, silicon nitride film). That is, the memory cell MC has a gate insulating film 25A, a charge storage layer 27 and a block insulating film 28 on the channel region between the diffusion layers 24. In this case, the select gate transistor ST has a gate electrode on the gate insulating film 25B.

A drain diffusion layer 24(d) at one end of the NAND cell unit is connected to the bit line BL1, and a source diffusion layer 24(s) is connected to a source line SL.

On the memory cell array 11, a plurality of word lines WL1, . . . WLn and a plurality of select gate lines SGS1, SGD1, . . . are arranged.

For instance, in the block BK1, n (n is plural number) word lines WL1, . . . WLn and two select gate lines SGS1, SGD1 are arranged. The word lines WL1, . . . WLn and the select gate lines SGS1, SGD1 extend in the row direction, and the respective lines are connected to signal lines (control gate line) CG1, . . . CGn and signal lines SGSV1, SGDV1 via a transfer transistor unit 21 (BK1) in the word line driver 17 (DRV1).

The signal lines CG1, . . . CGn, SGSV1, SGDV1 which respectively extend in the column direction intersecting the row direction, are connected to the selector 24.

A transfer transistor unit U (BK1) is comprised from a high voltage type MISFET so as to be able to transfer the potential higher than a power supply potential Vcc.

A booster 29 in the word line driver 17 (DRV1) receives decode signals output from the row decoder 15. The booster 29, when the block BK1 is selected, turns the transfer transistor unit U (BK1) ON, while when the block BK1 is not selected, the booster 29 turns the transfer transistor unit U (BK1) OFF.

Figure 6:
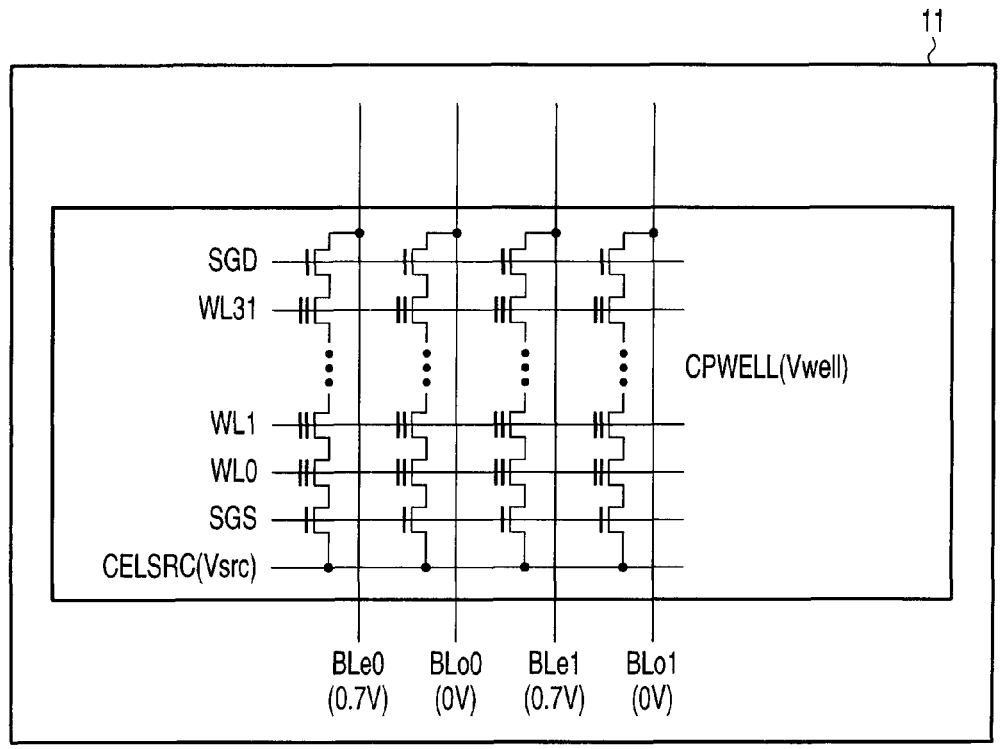
FIG. 6 is a conceptual view showing an area of a cell well.

FIG. 6 shows a configuration example of the cell well.

One cell well CPWELL is provided to, for instance, one block, that is, one cell well CPWELL is provided to, for instance, the block BKi (i=1, 2 . . . ) of FIG. 2.

Vwell is applied to the cell well CPWELL, and Vsrc is applied to the cell source (source line) CELSRC.

When the shield bit line read system is applied, two bit lines BLej, BLoj (j=0, 1, . . . ) result in pairs, and pre-charge potential (ex. 0.7V) is provided to one, while shield potential (ex. 0V) is provided to the other.

Figure 7:
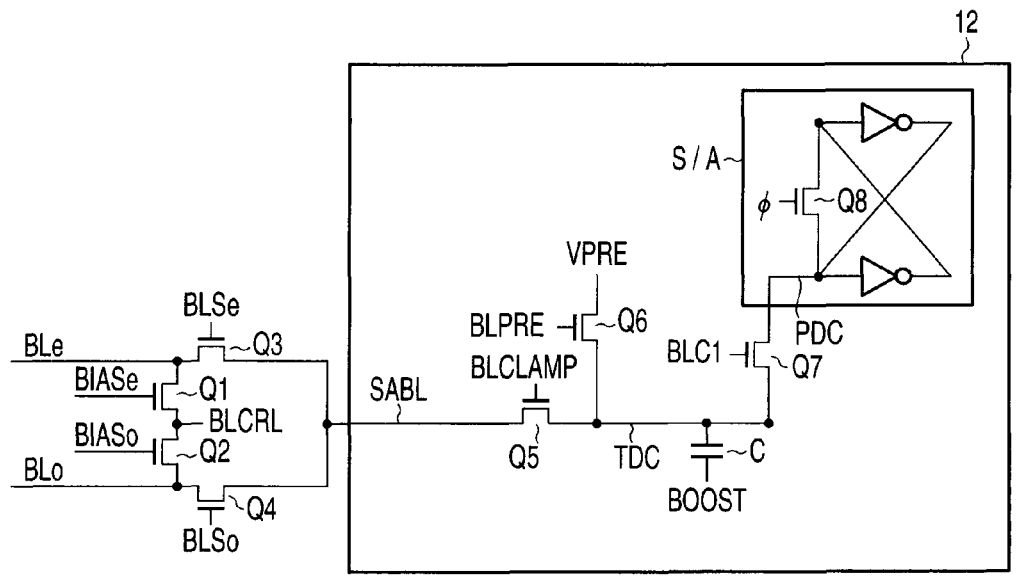
FIG. 7 is a circuit diagram showing a data latch circuit.

FIG. 7 shows a data latch circuit.

Here, described is the one (sense amplifier S/A or the like) relating to read operation in elements constituting the data latch circuit 12.

Transistors Q1, Q2 are circuits in which one of a pair of bit lines BLe, BLo is defined as the selection bit line, while the other is defined as the non-selection bit line (shield bit line). In addition, a transistor Q3 is a control circuit which controls electrical connection/disconnection between the pair of bit lines BLe, BLo and the data latch circuit 12.

A transistor Q5 is a clamp circuit, and a transistor Q6 is a pre-charge circuit. A transistor Q7 is a circuit for connecting the sense amplifier S/A to a TDC node, and a transistor Q8 is a circuit for activating the sense amplifier S/A.

A capacitor C retains the data read from the cell transistor temporarily, and functions as a level conversion circuit for converting its level.

FIG. 8 shows a circuit for setting the substrate potential, the bit line potential and the source line potential.

The control circuit 18 generates a bias Vs at the time of read.

The bias Vs is supplied to the cell source (source line) CELSRC and the cell well (p-type well region) CPWELL via a transistor Q9. In addition, when the shield bit line read system is applied, the bias Vs is supplied to one of the bit lines BLe, BLo via the transistors Q1, Q2, and Q9.

(2) Read (Including Verify Read) System

A. Principle of Negative Potential Read

There will be described a principle which is a premise of the present invention, by which the negative potential read is performed substantially while applying the positive potential to the selection word line.

Figure 9:
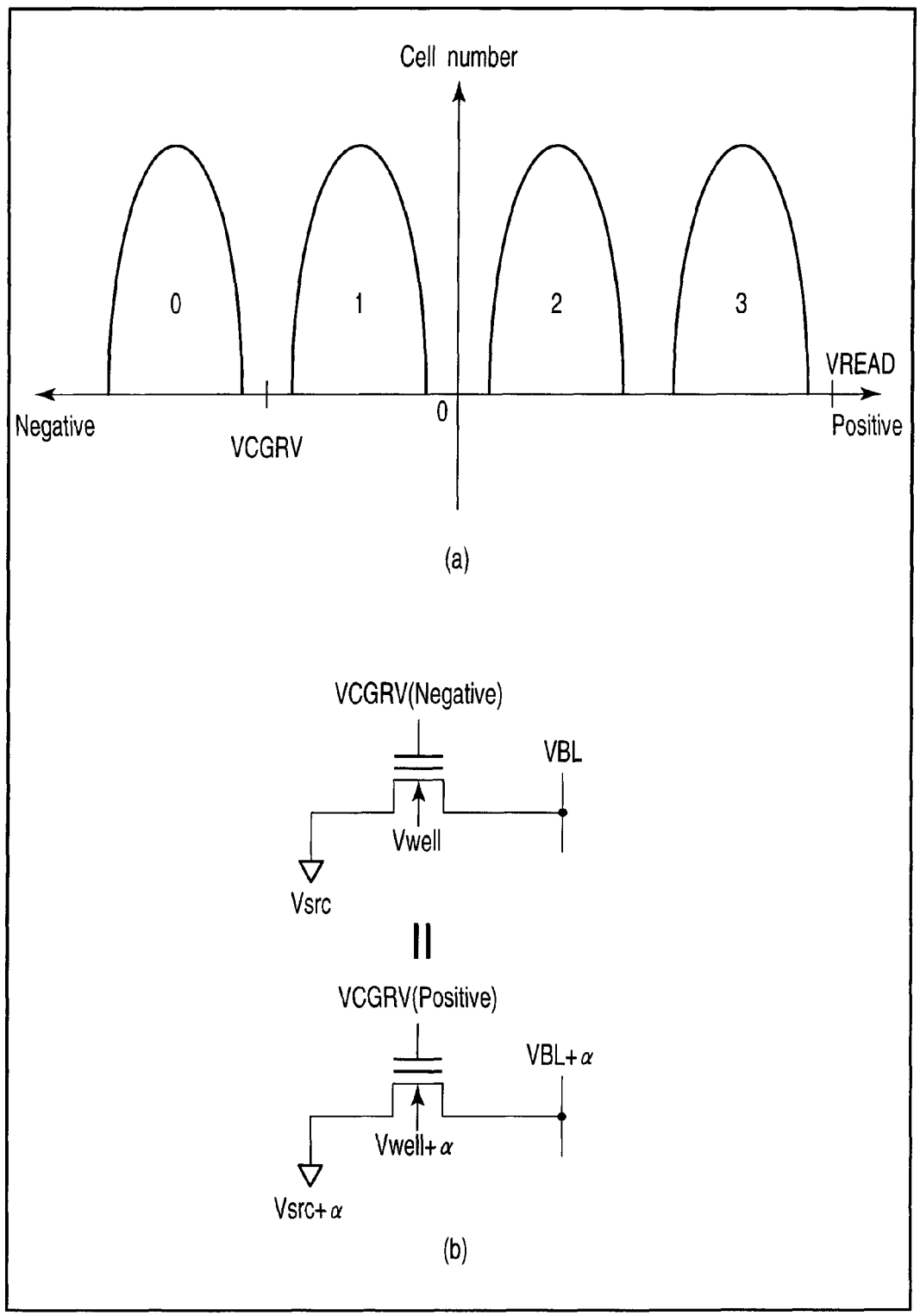
FIG. 9 is a view explaining a negative potential read principle.

FIG. 9 shows the negative potential read relating to the present invention.

Here, for simplification, it is assumed that four levels ("0", "1", "2", and "3") are stored in the memory cell. In addition, the threshold distributions of "0" and "1" are set in the negative region lower than 0V, while the threshold distributions of "2" and "3" are set on the positive region higher than 0V.

In order to discriminate "0" from additional "1", "2", and "3", VCGRV as the read potential is applied to the selection word line in the selection block, and the transfer potential VREAD is applied to the non-selection word line in the selection block. The transfer potential VREAD is a level making the cell transistor ON invariably regardless of the data "0", "1", "2", and "3".

In this case, the read potential VCGRV becomes negative in principle.

However, assuming that the cell well is set to Vwell, the cell source is set to Vsrc, and the selection bit line is set to VBL (pre-charge potential) when providing the negative potential to the selection word line, that is, to the control gate electrode of the cell transistor (selection cell), in accordance with the following device, it is possible to perform the negative potential read substantially by providing the positive potential to the selection word line.

Specifically, assuming that the selection bit line is set to VBL+α (=Vs), the cell well is set to Vwell+α (=Vs), and the cell source is set to Vsrc+α (=Vs), it is possible to discriminate "0" from additional "1", "2", and "3", while setting the potential VCGRV+α (=Vs) applied to the selection word line to positive.

However, the bit line is a large load, and when providing VBL+α to the bit line by using the booster, the booster having large driving ability becomes necessary, so that the chip area increases.

Accordingly, in the present invention, the bias VBL+α is created in such a way that the bias α is applied to the non-selection bit line, the cell well, and the cell source, and for the selection bit line, the capacitance coupling between the non-selection bit line and the selection bit line, the capacitance coupling between the cell well and the selection bit line, and the capacitance coupling between the cell source and the selection bit line are utilized.

In this manner, even if the threshold distributions are set in the negative side, it is possible to perform the negative potential read substantially by using only the positive potentials as the potential applied to the selection word line at the time of read. Furthermore, for this purpose, it is not necessary to provide the booster having large driving ability.

In the description of the present principle, although the description has been made about four levels, naturally, the same matters can be applied to the case of the multi-level memory of three levels or five levels or more. In addition, also the number of the threshold distributions set at the negative side may be three or more, without being limited to two.

B. Specific Operation

First Example

Figure 10:
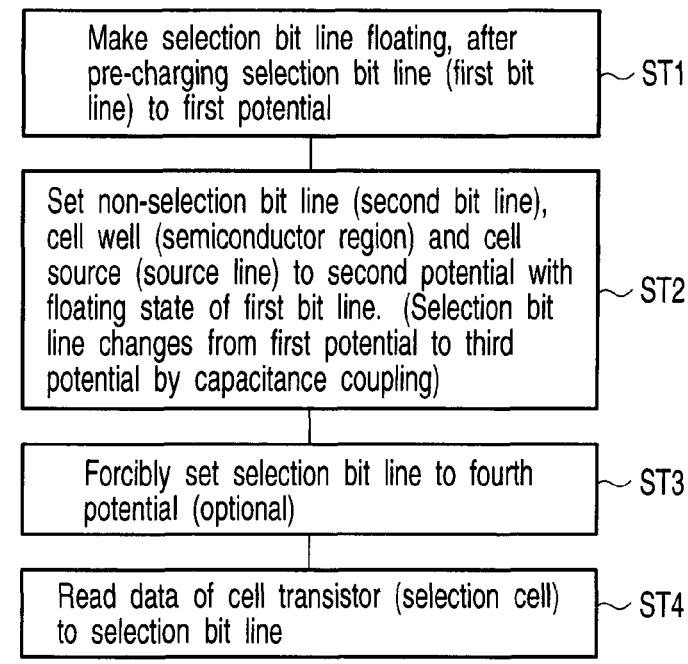
FIG. 10 is a view showing a flow of a negative potential read system.

FIG. 10 shows the first example of the read operation.

First, the selection bit line (the first bit line) is made floating, after pre-charging the selection bit line to the first potential (step ST1).

Next, with the floating state of the selection bit line, the potential of the selection bit line is varied to the third potential from the first potential by using the capacitance coupling while providing the second potential to the non-selection bit line (the second bit line), the cell well (semiconductor region) and the cell source (source line) (step ST2).

Here, even if the third potential is the value exceeding the power supply potential, it is possible to create the third potential without necessitating the booster.

Next, by using the booster, the selection bit line is set to the fourth potential forcibly (step ST3). This step is optional. For instance, when variation is not generated in the values of the third potential between the bit lines, this step is not necessary.

When variations of the bit line bias occur by utilizing only the capacitance coupling, the bit line is fixed to the fourth potential by using the booster supplementarily. In this case, since an object of the booster is to only eliminate variations of the potential between the bit lines, the driving ability of the booster may be small.

After that, if the data of the cell transistor is read to the selection bit line while providing the positive read potential to the selection word line, it is possible to perform the negative potential read substantially (step ST4).

Second Example

Figure 11:
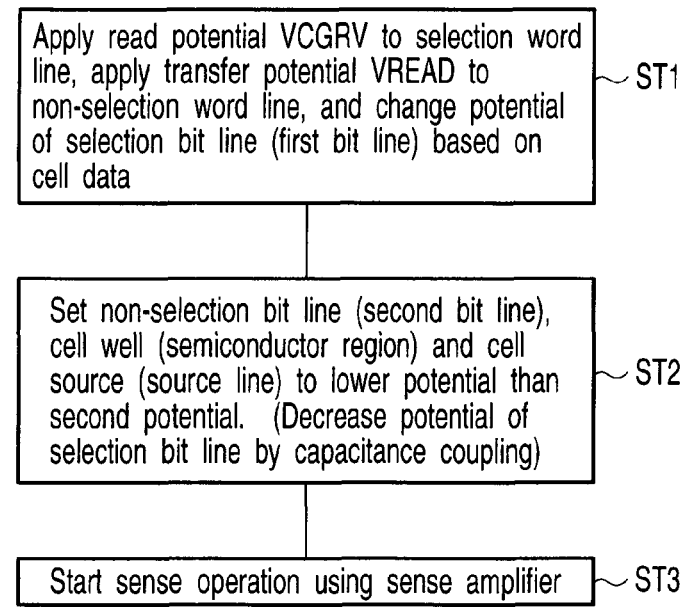
FIG. 11 is a view showing a flow of a negative potential read system.

FIG. 11 shows the second example of the read operation.

The second example relates to the sense operation by the sense amplifier.

First, the negative potential read is executed while providing the read potential (positive potential) VCGRV to the selection word line and providing the transfer potential VREAD to the non-selection word line, after completing at least steps ST1 to ST2 of FIG. 10 (step ST1).

At this time, the potential of the selection bit line (the first bit line) varies according to the cell data.

For instance, when the cell transistor (selection cell) is in the state of "0" of FIG. 9, the cell transistor becomes ON state, and thus the selection bit line discharges, so that the potential lowers. In addition, when the cell transistor (selection cell) is in the state of "1" of FIG. 9, the cell transistor becomes OFF state, and thus the potential of the selection bit line does not change.

Then, during read of the cell data or after that, the non-selection bit line (the second bit line), the cell well (semiconductor region) and the cell source (source line) are set to lower potential than the second potential (step ST2).

At this time, the potential according to the cell data of the selection bit line lowers due to the capacitance coupling between the cell well and the selection bit line and the capacitance coupling between the cell source and the selection bit line.

After that, the potential of the selection bit line is lead to the sense amplifier, to start the sense operation (step ST3).

Here, the sense amplifier is comprised of, for instance, two inverters with a flip-flop connection. The potential of the selection bit line which is subjected to boost-up in step ST2 of FIG. 10, is subjected to boost-down in step ST2 of FIG. 11, and therefore, even the inverter having conventional circuit threshold can discriminate "H"/"L".

That is, it is not necessary for the sense amplifier to be comprised of the high voltage system transistor.

C. Level Conversion Circuit

An example will be described in which the same function as the boost-down in the step ST2 of FIG. 10 and FIG. 11 is realized by the level conversion circuit.

Figure 12:
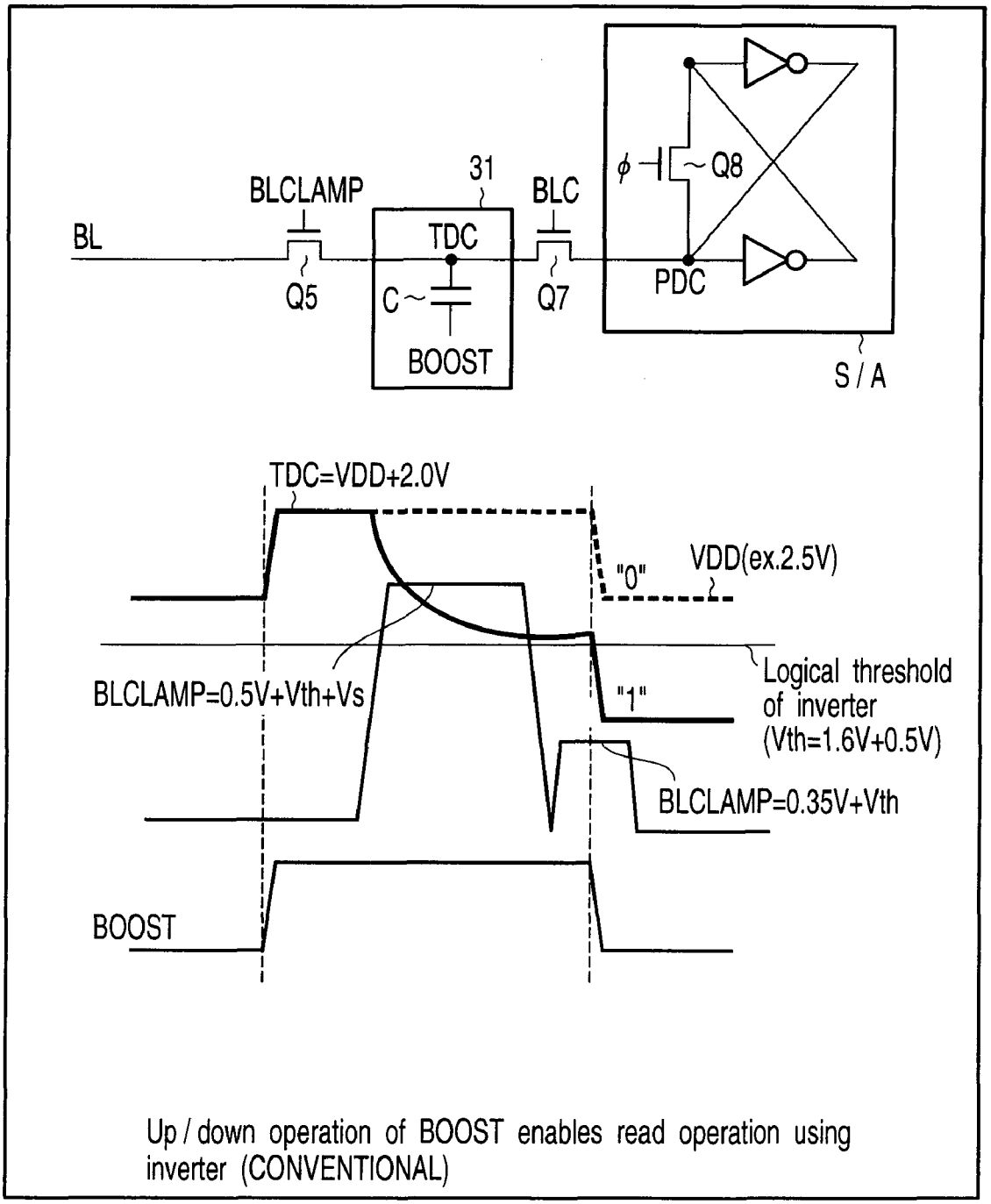
FIG. 12 is a view explaining a level conversion principle by a level conversion circuit.

FIG. 12 shows the level conversion circuit.

The level conversion circuit 31 is connected between the bit line BL and the sense amplifier S/A. The level conversion circuit 31 is comprised of a capacitor C in which boost signals BOOST and inputted to one end, and a connection node TDC is connected to the other end.

The transistor Q5 is connected between the bit line BL and the level conversion circuit 31, and the transistor Q7 is connected between the level conversion circuit 31 and the sense amplifier S/A.

The level conversion circuit 31 has a function to lower the level of the cell data by constant quantity for discriminating the cell data read to the bit line BL by using the sense amplifier (inverter) S/A.

With respect to the read system using the level conversion circuit 31, the read system will be described while referring to FIGS. 6 to 8 and 12.

Assume that the potential Vsrc of the cell source CELSRC and the potential Vwell of the cell well CPWELL are Vs (=1.6V). Assume that VPRE is set to VDD (=2.5V), and BLPRE is set to VSG (=VDD+Vth (=4V)) capable of transferring VDD when the transistor Q6 is an N channel MISFET. However, Vth is the threshold voltage of the transistor Q6.

Under such potential relation, the bit line BL of FIG. 12 is subjected to the pre-charge to 0.7V+Vs (=2.3V), by setting BLCLAMP to 0.7V+Vth+Vs.

After the pre-charge of the bit line BL, BLCLAMP becomes 0V, and the bit line BL is electrically disconnected from the level conversion circuit 31 and the sense amplifier S/A.

After that, the read potential VCGRV is provided to the selection word line, VREAD (=6.5V) is provided to the other non-selection word line, and further VREAD is provided to a source side select gate line SGS.

At this time, if the selection cell is turned ON, a cell current flows, and thus the potential of the bit line BL lowers, and the bit line BL approaches Vs. In addition, if the selection cell is turned OFF, the cell current does not flow, and thus the bit line BL maintains the pre-charge potential (0.7V+Vs (=2.3V)).

Again, VPRE and BLPRE are raised, and a connection node TDC is subjected to the pre-charge to VDD. In addition, BOOST is raised, and the connection node TDC is increased to about 4.5V (=VDD+2.0V) due to the capacitance coupling.

After that, BLCLAMP is set to VSEN (0.5V+Vth+Vs).

Since the capacitance of the connection node TDC is sufficiently small compared with the capacitance of the bit line BL, when the potential of the bit line BL becomes lower than 0.5V+Vs due to ON cell, the transistor Q5 is turned ON and charge share is performed. As a result, the potential of the connection node TDC becomes equal to the potential of the bit line BL.

In addition, if the potential of the bit line BL maintains 0.7V+Vs due to OFF cell, even though BLCLAMP is set to VSEN, the transistor Q5 maintains OFF. For this reason, the connection node TDC is kept to be 4.5V.

After that, when lowering down the BOOST with the state that BLCLAMP is lowered down, and BLCLAMP is made VTR (=1.2V (=0.35V+Vth)) which is slightly higher than threshold voltage of the transistor Q5, the potential of the connection node TDC lowers by the capacitance coupling.

Specifically, when the selection cell is ON cell, the potential of the connection node TDC lowers to the vicinity of 0V, while when the selection cell is OFF cell, the potential of the connection node TDC lowers to the vicinity of VDD from 4.5V (=VDD+2.0V).

Therefore, after that, when transferring the potential of the connection node TDC to the sense amplifier (inverter) S/A while raising BLC, it is possible to discriminate "H"/"L" by the conventional sense amplifier S/A having a circuit threshold in the proximity of 2.3V (=1.6V+0.5V).

An amplitude of the BOOST is demanded the same degree as Vs or more, when the cell source CELSRC and the cell well CPWELL are biased to Vs.

When Vs is more than the power supply potential VDD, since BOOST also becomes more than the power supply potential VDD, the booster becomes necessary to create BOOST. That is, by using the booster, for instance, the potential of the connection node TDC should be set to VDD+BOOST=2.7V+3.5V=6.2V.

From such standpoint, it is more desirable to perform the level conversion by operative technique as shown in FIGS. 10 and 11 than using the level conversion circuit.

(3) Embodiment of Read Operation

In the embodiment below, symbols correspond to symbols of circuits shown in FIGS. 6 to 8.

A. First Embodiment

The first embodiment relates to a shield bit line read system.

Figure 13:
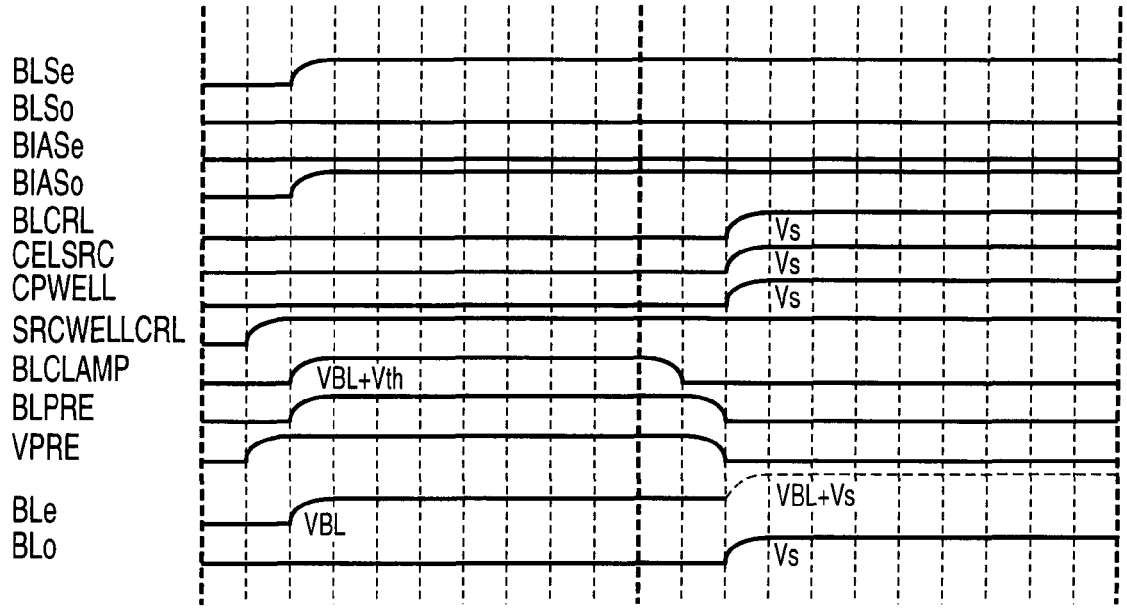
FIG. 13 is an operation waveform diagram of a first embodiment.

FIG. 13 shows an operation waveform diagram according to the first embodiment.

First, SRCWELLCRL, VPRE are raised. In addition, BLSe, BIASo are raised, a bit line BLe is set to the selection bit line, and a bit line BLo is set to the non-selection bit line (shield bit line).

When BLCLAMP is set to VBL+Vth, and BLPRE is raised, the selection bit line BLe is charged to VBL (=0.7V). In this stage, the non-selection bit line (shield bit line), the cell source CELSRC, and cell well CPWELL have 0V.

After that, BLCLAMP, BLPRE, and VPRE are made to lower down, and the non-selection bit line BLo (BLCRL), the cell source CELSRC, and the cell well CPWELL are raised to Vs (=2.5V) from 0V.

At this time, since the selection bit line BLe is in the floating state, the potential increases to VBL+Vs (=3.2V) due to the capacitance coupling.

Thus, at the time of read, it is possible to set the selection bit line BLe to a value more than the power supply potential VDD due to the capacitance coupling.

Meanwhile, it is desirable for Vs to possess characteristics to compensate temperature dependency of the threshold voltage of the cell transistor.

B. Second Embodiment

The second embodiment relates to the shield bit line read system.

Figure 14:
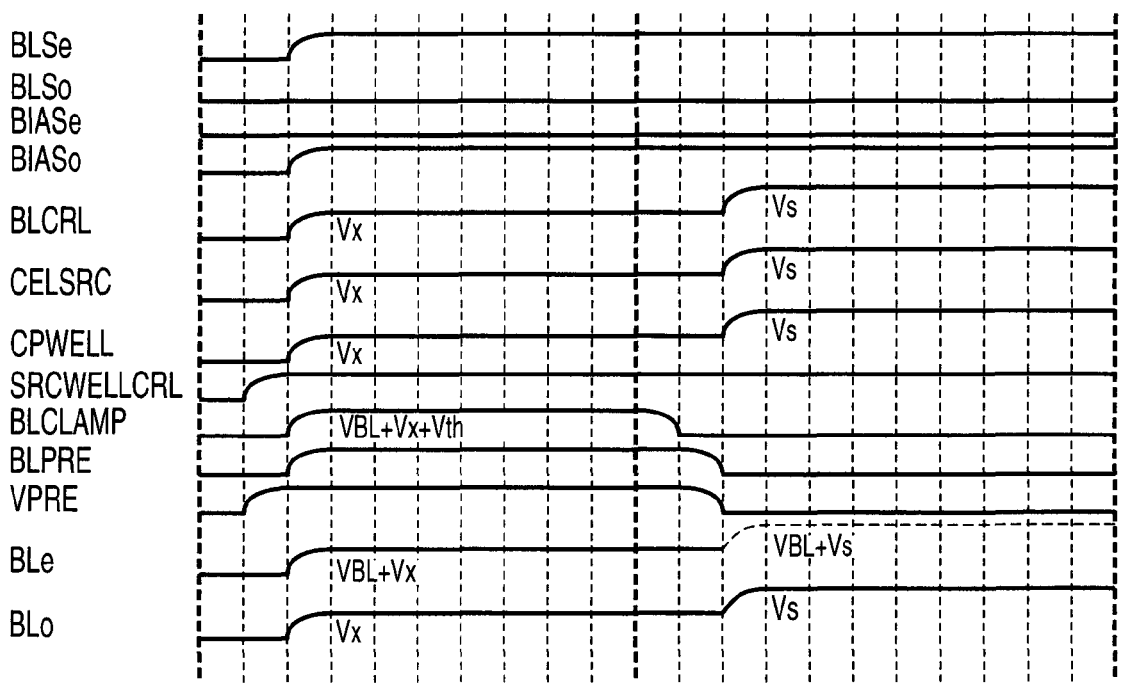
FIG. 14 is an operation waveform diagram of a second embodiment.

FIG. 14 shows an operation waveform diagram according to the second embodiment.

First, SRCWELLCRL, VPRE are raised. In addition, BLSe, BIASo are raised, a bit line BLe is set to the selection bit line, and a bit line BLo is set to the non-selection bit line (shield bit line).

When BLCLAMP is set to VBL (=0.7V)+Vx (=1.6V)+Vth, and BLPRE is raised, the selection bit line BLe is charged to VBL+Vx (=2.3V). In this stage, the non-selection bit line (shield bit line), the cell source CELSRC, and cell well CPWELL have Vx.

After that, BLCLAMP, BLPRE, and VPRE are made to lower down, and the non-selection bit line BLo (BLCRL), the cell source CELSRC, and the cell well CPWELL are raised to Vs (=2.5V) from Vx.

At this time, since the selection bit line BLe is in the floating state, the potential increases to VBL+Vs (=3.2V) due to the capacitance coupling.

Thus, at the time of read, it is possible to set the selection bit line BLe to a value more than the power supply potential VDD due to the capacitance coupling.

Meanwhile, it is desirable for Vx, Vs to possess characteristics to compensate temperature dependency of the threshold voltage of the cell transistor.

C. Third Embodiment

The third embodiment relates to the shield bit line read system.

Figure 15:
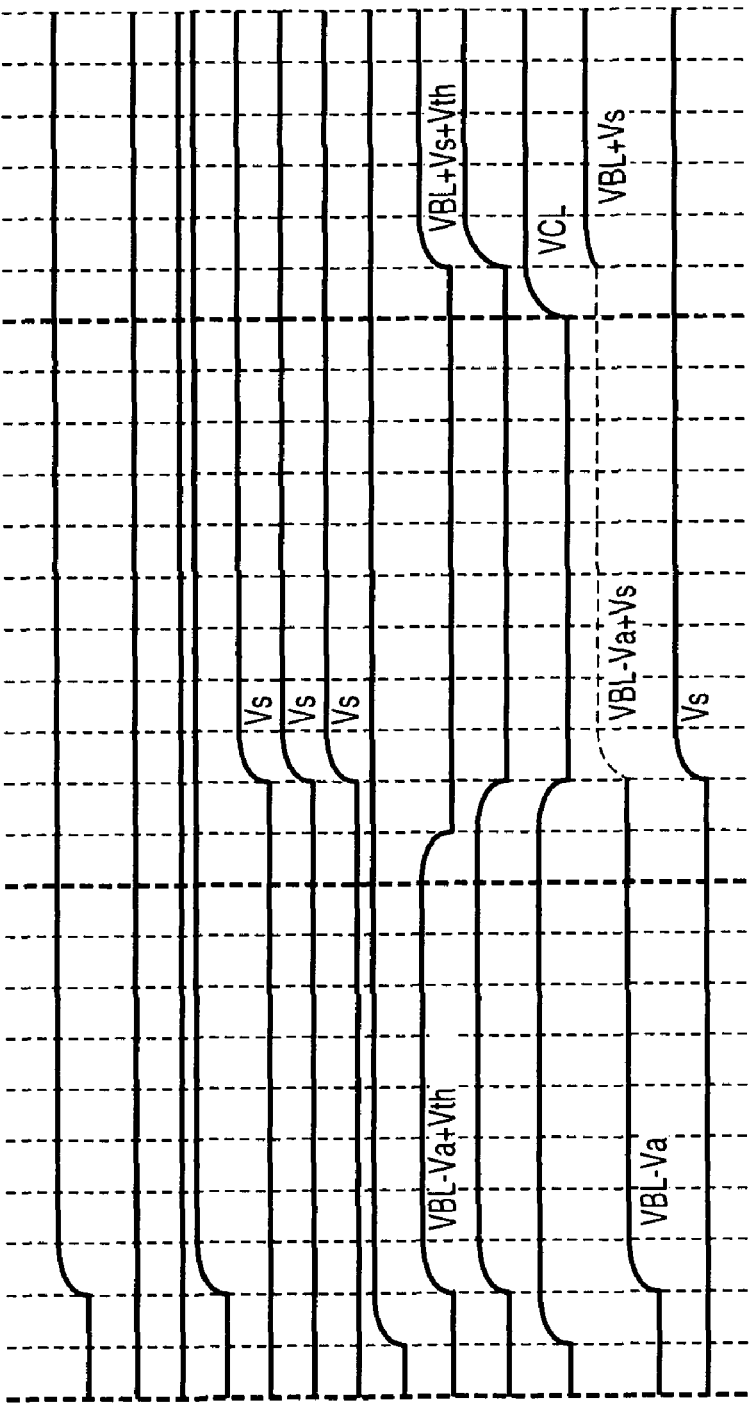
FIG. 15 is an operation waveform diagram of a third embodiment.

FIG. 15 shows an operation waveform diagram to the third embodiment.

First, SRCWELLCRL, VPRE are raised. In addition, BLSe, BIASo are raised, a bit line BLe is set to the selection bit line, and a bit line BLo is set to the non-selection bit line (shield bit line).

When BLCLAMP is set to VBL (=0.7V)−Va (=0.1V)+Vth, and BLPRE is raised, the selection bit line BLe is charged to VBL−Va (=0.6V). In this stage, the non-selection bit line (shield bit line), the cell source CELSRC, and cell well CPWELL have 0V.

After that, BLCLAMP, BLPRE, and VPRE are made to lower down, and the non-selection bit line BLo (BLCRL), the cell source CELSRC, and the cell well CPWELL are raised to Vs (=2.5V) from 0V.

At this time, since the selection bit line BLe is in the floating state, the potential increases to VBL−Va+Vs (=3.1V) due to the capacitance coupling.

In addition, again, VPRE, BLCLAMP, and BLPRE are raised, and by using the booster, the selection bit line BLe is set to VBL+Vs (=3.2V) from VBL−Va+Vs (=3.1V) forcibly.

According to this system, at the time of read, it is possible to set the selection bit line BLe to a value more than the power supply potential VDD due to the capacitance coupling. In addition, it is possible to cancel variation of the potential of the selection bit line caused by variations of a shape or the like of the bit line.

Meanwhile, it is desirable for Vs to possess characteristics to compensate temperature dependency of the threshold voltage of the cell transistor.

D. Fourth Embodiment

The fourth embodiment relates to the shield bit line read system.

Figure 16:
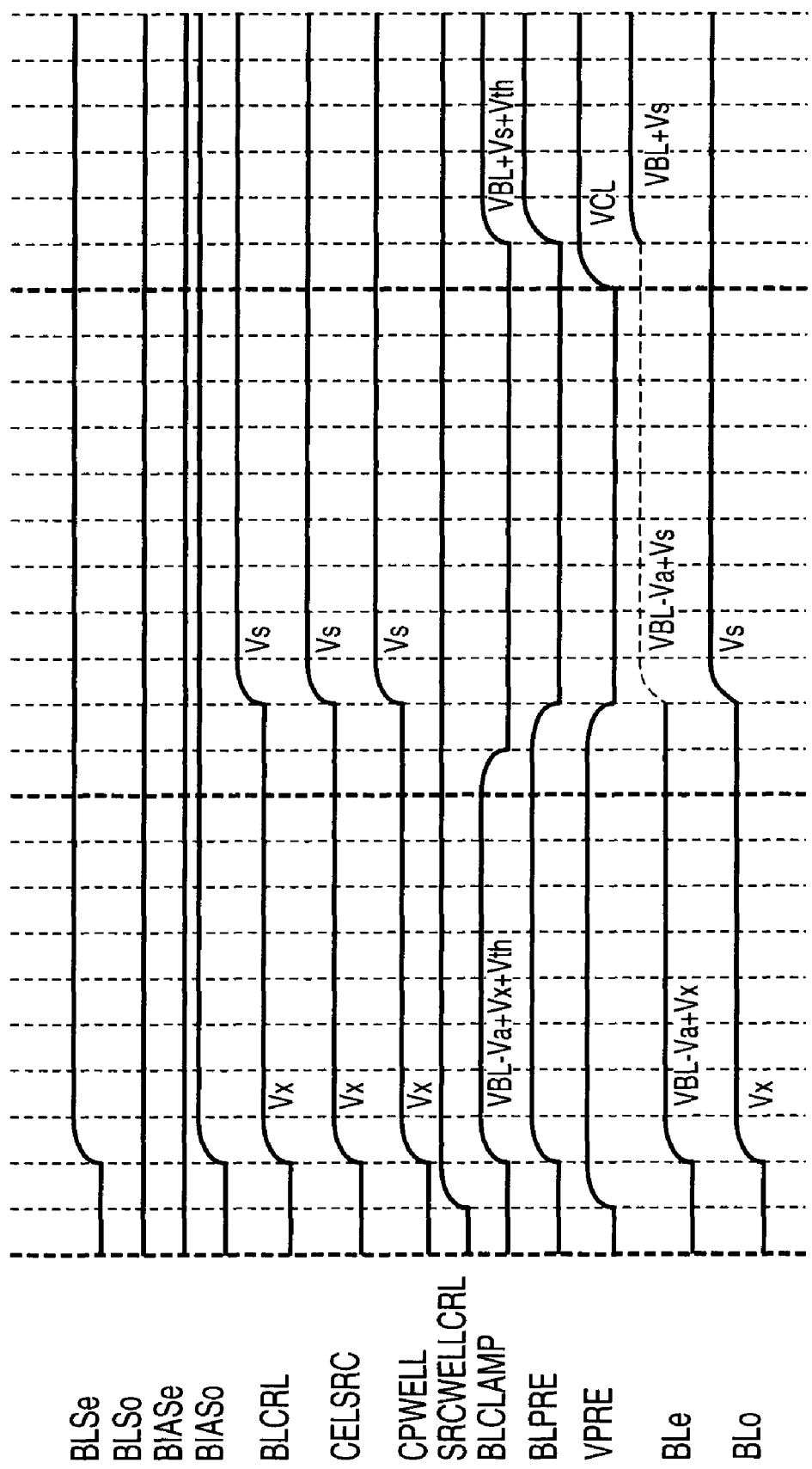
FIG. 16 is an operation waveform diagram of a fourth embodiment.

FIG. 16 shows an operation waveform diagram according to the fourth embodiment.

First, SRCWELLCRL, VPRE are raised. In addition, BLSe, BIASo are raised, a bit line BLe is set to the selection bit line, and a bit line BLo is set to the non-selection bit line (shield bit line).

When BLCLAMP is set to VBL (=0.7V)−Va (=0.1V)+Vx (=1.6V)+Vth, and BLPRE is raised, the selection bit line BLe is charged to VBL−Va+Vx (=2.2V). In this stage, the non-selection bit line (shield bit line), the cell source CELSRC, and the cell well CPWELL have Vx.

After that, BLCLAMP, BLPRE, and VPRE are made to lower down, and the non-selection bit line BLo (BLCRL), the cell source CELSRC, and the cell well CPWELL are raised to Vs (=2.5V) from Vx.

At this time, since the selection bit line BLe is in the floating state, the potential increases to VBL−Va+Vs (=3.1V) due to the capacitance coupling.

In addition, again, VPRE, BLCLAMP, and BLPRE are raised, and by using the booster, the selection bit line BLe is set to VBL+Vs (=3.2V) from VBL−Va+Vs (=3.1V) forcibly.

According to this system, at the time of read, it is possible to set the selection bit line BLe to a value more than the power supply potential VDD due to the capacitance coupling. In addition, it is possible to cancel variation of the potential of the selection bit line caused by variations of a shape or the like of the bit line.

Meanwhile, it is desirable for Vx, Vs to possess characteristics to compensate temperature dependency of the threshold voltage of the cell transistor.

E. Fifth Embodiment

The fifth embodiment relates to the sense operation after the cell data is read to the selection bit line, and includes all the characteristics of the first embodiment relating to the operation before the sense operation.

Figure 17:
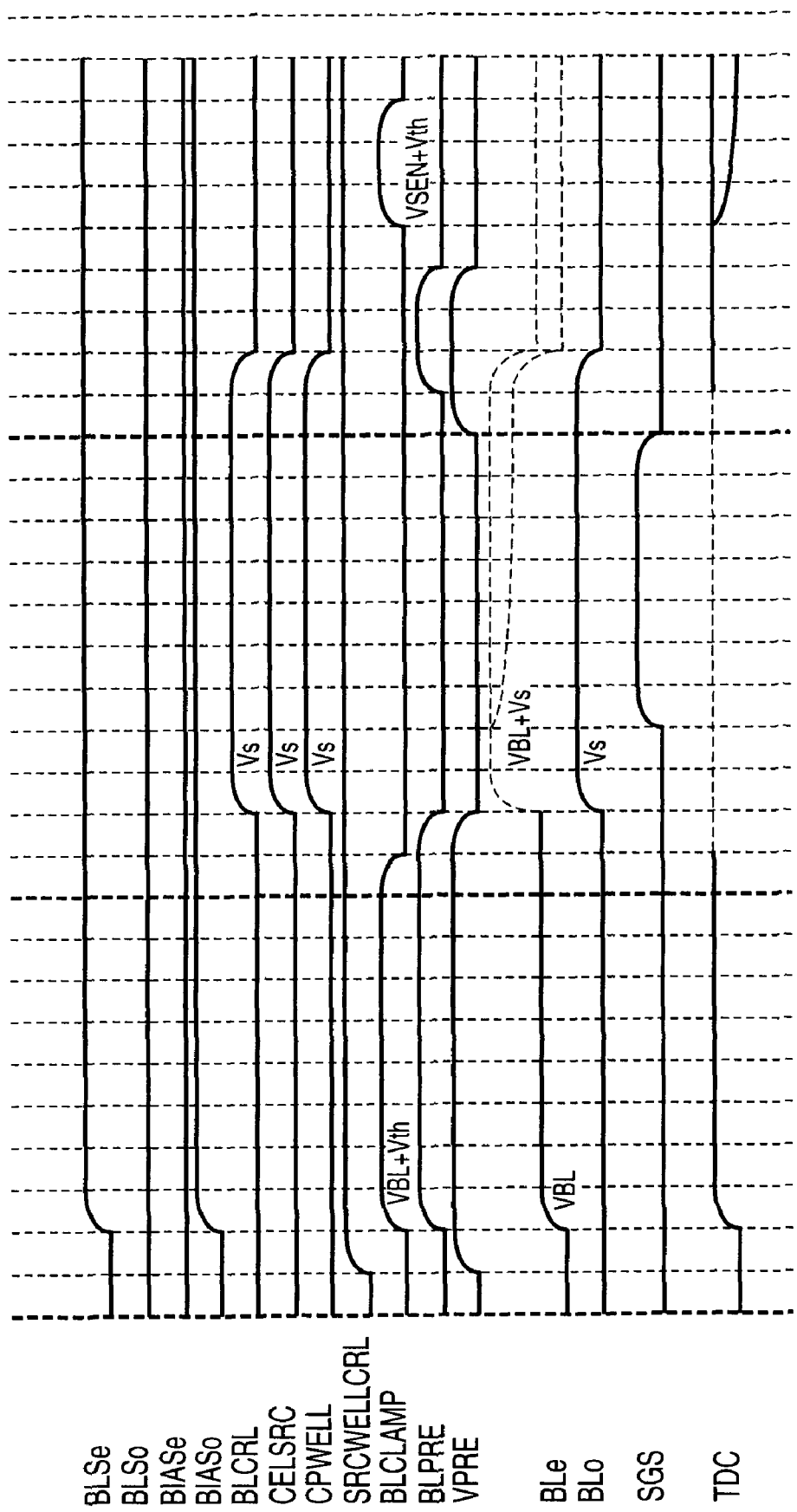
FIG. 17 is an operation waveform diagram of a fifth embodiment.

FIG. 17 shows an operation waveform diagram according to the fifth embodiment.

Since the operation until the selection bit line BLe is set to VBL+Vs is the same as that of the first embodiment, the description thereof will be omitted.

After that, the source side select gate transistor is made ON by providing VREAD to the source side select gate line SGS. In addition, the non-selection cell is made ON, by providing VREAD also to the non-selection word line in the selection block. Further, VCGRV is provided to the selection word line.

At this time, when the selection cell is in ON state, the cell current flows, and thus the potential of the selection bit line BLe results in a value lower than VBL+Vs. In addition, when the selection cell is in OFF state, the cell current does not flow, and thus the potential of the selection bit line BLe is kept to be VBL+Vs.

Then, SGS is set to 0V, and the selection bit line BLe having the potential corresponding to the cell data is made floating. In addition, again, VPRE, BLPRE are raised, and the connection node TDC is subjected to the pre-charge to VDD.

Further, the non-selection bit line BLo (BLCRL), the cell source CELSRC and the cell well CPWELL are lowered down from Vs to 0V. At this time, since the selection bit line BLe is in the floating state, the potential lowers due to the capacitance coupling.

After that, BLCLAMP is set to VSEN (=0.5V)+Vth.

Since capacitance of the connection node TDC is sufficiently small compared with the capacitance of the selection bit line BLe, if level of the selection bit line BLe is lower than 0.5V by ON cell, the transistor Q5 in which BLCLAMP is applied to a gate thereof is turned ON, and the potential of the connection node TDC becomes equal to a level of the selection bit line BLe by the charge share.

In addition, if level of the selection bit line BLe is about 0.7V by OFF cell, the transistor Q5 is in OFF state and the connection node TDC maintains VDD.

Then, BLC is raised, the potential of the connection node TDC is transferred to the sense amplifier (inverter) S/A, and "H"/"L" is discriminated.

According to such sense operation, it is not necessary to perform up/down operation by the level conversion circuit of FIG. 12, that is, by the BOOST. For this reason, it is not necessary to provide the booster for the BOOST, so that it is possible to realize the negative potential read without modifying the device and without increase in the chip area.

Meanwhile, it is desirable for Vs to possess characteristics to compensate temperature dependency of the threshold voltage of the cell transistor.

F. Sixth Embodiment

The sixth embodiment relates to the sense operation after the cell data is read to the selection bit line, and includes all the characteristics of the second embodiment relating to the operation before the sense operation.

Figure 18:
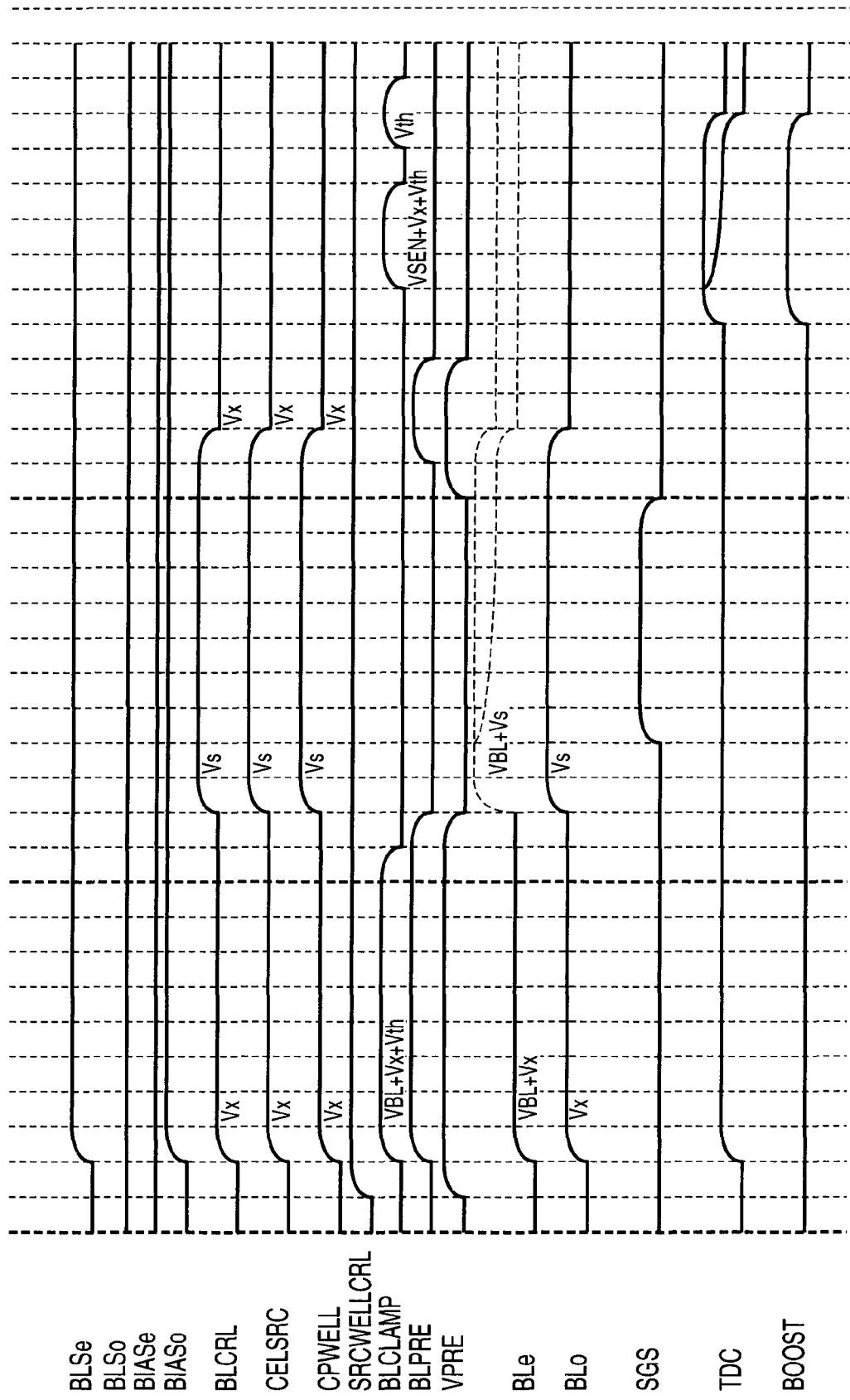
FIG. 18 is an operation waveform diagram of a sixth embodiment.

FIG. 18 shows an operation waveform diagram relating to the sixth embodiment.

Since the operation until the selection bit line BLe is set to VBL+Vs is the same as that of the second embodiment, the description thereof will be omitted.

After that, the source side select gate transistor is made ON by providing VREAD to the source side select gate line SGS. In addition, the non-selection cell is made ON, by providing VREAD also to the non-selection word line in the selection block. Further, VCGRV is provided to the selection word line.

At this time, when the selection cell is in ON state, the cell current flows, and thus the potential of the selection bit line BLe results in a value lower than VBL+Vs. In addition, when the selection cell is in OFF state, the cell current does not flow, and thus the potential of the selection bit line BLe is kept to be VBL+Vs.

Then, SGS is set to 0V, and the selection bit line BLe having the potential according to the cell data is made floating. In addition, again, VPRE, BLPRE are raised, and the connection node TDC is subjected to the pre-charge to VDD (ex. 2.5V).

In addition, the BOOST is raised, and the connection node TDC is made to increase to about 4.5V from VDD due to the capacitance coupling.

On the other hand, the non-selection bit line BLo (BLCRL), the cell source CELSRC and the cell well CPWELL are lowered down from Vs to Vx. At this time, since the selection bit line BLe is in the floating state, the potential lowers due to the capacitance coupling.

After that, BLCLAMP is set to VSEN (=0.5V)+Vx+Vth.

Since capacitance of the connection node TDC is sufficiently small compared with the capacitance of the selection bit line BLe, if the level of the selection bit line BLe is lower than 0.5V+Vx by ON cell, the transistor Q5 in which BLCLAMP is applied to a gate thereof is turned ON, and the potential of the connection node TDC becomes equal to the level of the selection bit line BLe by the charge share.

In addition, if the level of the selection bit line BLe is about (0.7V+Vx) by OFF cell, the transistor Q5 is in OFF state, and the connection node TDC maintains about 4.5V.

Then, after lowering down BLCLAMP once, when BLCLAMP is maintained to the potential VTR (ex. 1.2V) which is slightly higher than the threshold of the transistor Q5, and the BOOST is lowered down, the potential of the connection node TDC lowers due to the capacitance coupling.

The connection node TDC connected to ON cell lowers to the vicinity of 0V, while the connection node TDC connected to OFF cell lowers to the vicinity of VDD.

After that, BLC is raised, the potential of the connection node TDC is transferred to the sense amplifier (inverter) S/A, and "H"/"L" is discriminated.

According to such sense operation, the potential of the non-selection bit line BLo, the cell source CELSRC, and the cell well CPWELL ascends or descends with two stages (0V→Vx→Vs, Vs→Vx→0V).

In this case, there is an effect that the potential variation of the selection bit line BLe caused by the capacitance coupling becomes small. In addition, it is possible to realize the negative potential read without modifying the device and without increasing the chip area.

Meanwhile, it is desirable for Vx, Vs to possess characteristics to compensate temperature dependency of the threshold voltage of the cell transistor.

G. Seventh Embodiment

The seventh embodiment relates to a read system when the present invention is applied to the ABL sense circuit.

Figure 19:
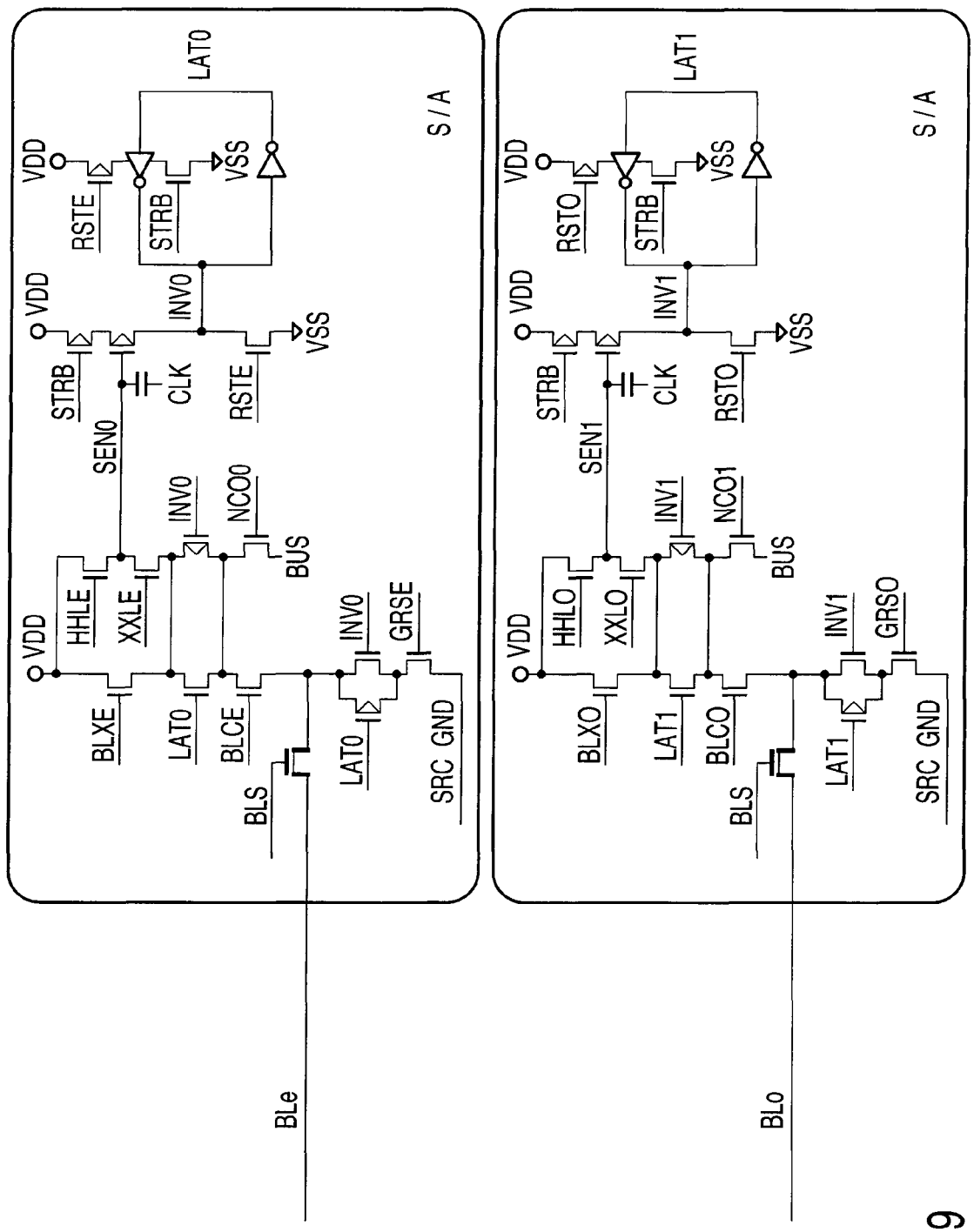
FIG. 19 is a circuit diagram showing an ABL sense circuit.

FIG. 19 shows the sense amplifier according to the seventh embodiment.

The characteristics of the sense amplifier lies in a point that one sense amplifier S/A is connected to one bit line.

Symbols in the drawings express signals or potentials.

Figure 20:
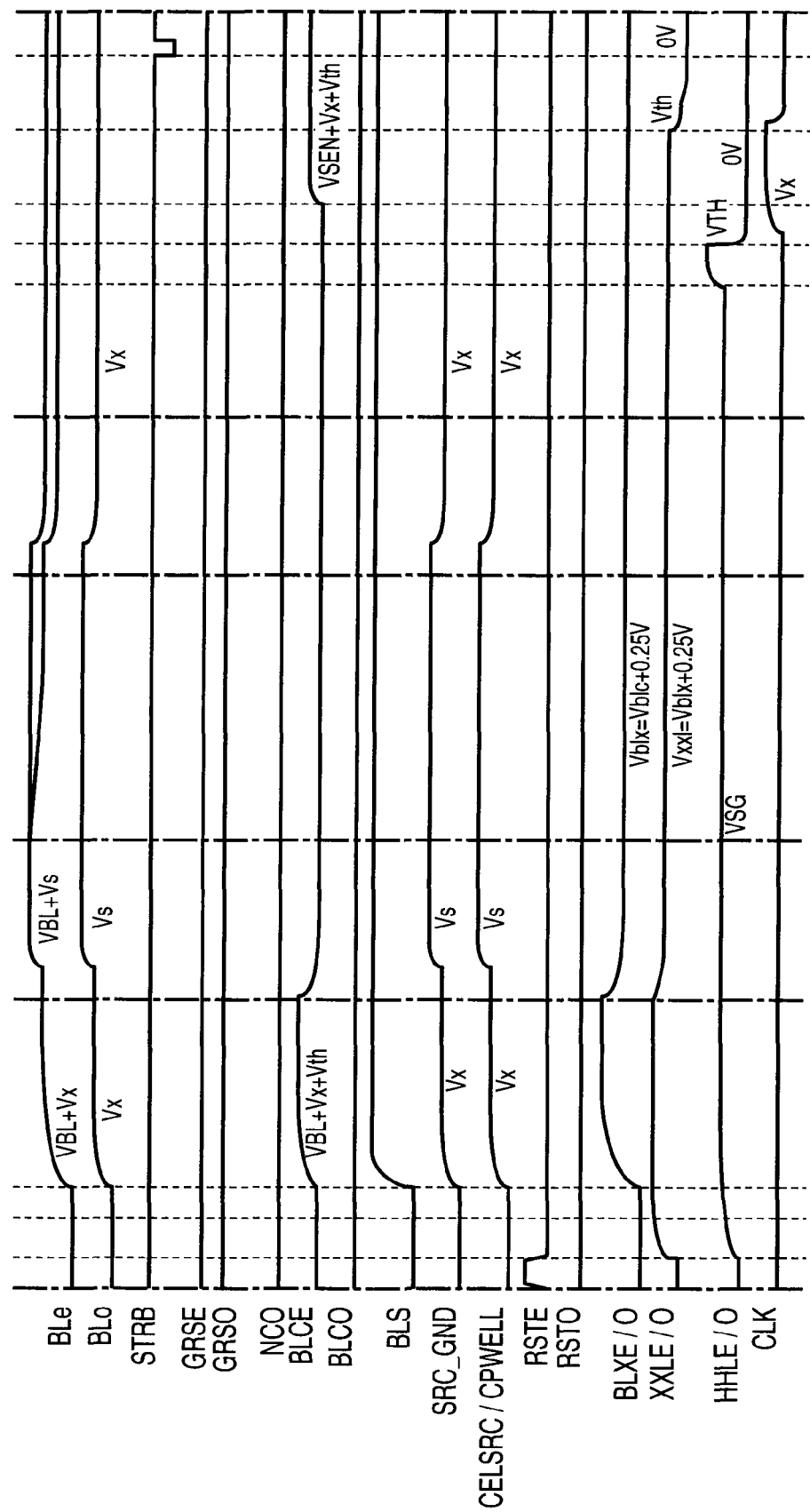
FIG. 20 is an operation waveform diagram of a seventh embodiment.
Figure 21:
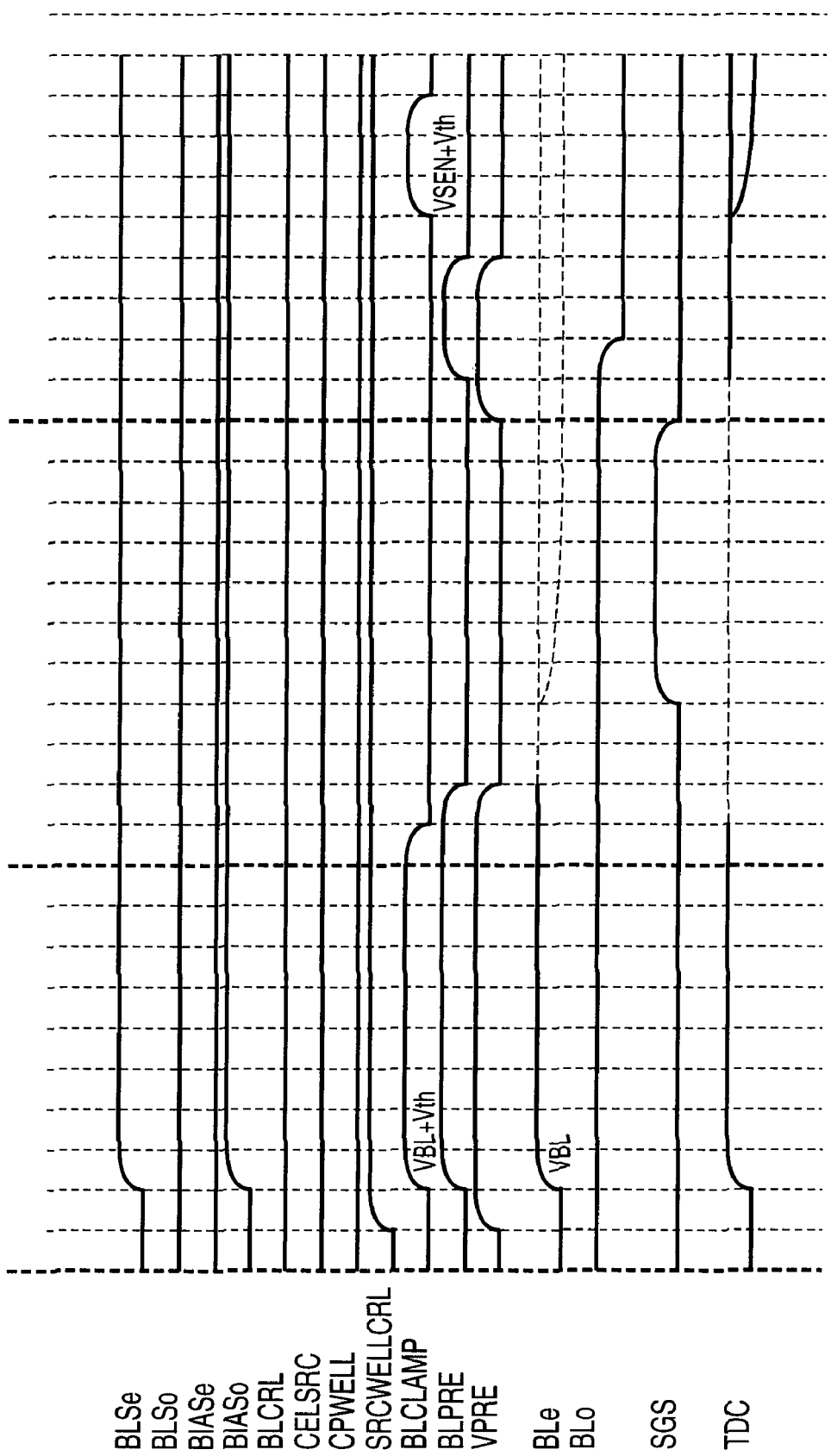
FIG. 21 is an operation waveform diagram of the seventh embodiment.

FIGS. 20 and 21 show the operation waveform diagram according to the seventh embodiment.

The symbols correspond to signals or potentials in FIG. 19.

Assume that, in the initial values, there are set that INV0, INV1="H", and LAT0, LAT1="L".

RSTE is lowered down, and there are set that INV0="L", and LAT0="L".

There are set that BLCE=VBL+Vx+Vth, and BLC0=VSS.

BLXE, BLX0, HHLE, HHL0, XXLE, XXL0, and BLS are raised.

GRSE is set to "L", and GRS0 is set to "H".

BLo (shield bit line) connected to the sense amplifier S/A in which there is set that INV1/LAT1="H"/"L", results in SRC GND=Vx.

BLe (selection bit line) connected to the sense amplifier S/A in which there is set that INV0/LAT0="L"/"H", results in VBL+Vx.

CELSRC and CPWELL are raised to Vx.

As a result, the selection bit line BLe results in 2.3V (VBL+Vx=0.7V+1.6V=2.3V). In addition, the non-selection bit line (shield bit line), the cell source (source line) CELSRC, and the cell well (semiconductor region) CPWELL are charged to 1.6V (Vx=1.6V).

The non-selection bit line BLo, the cell source CELSRC, and the cell well CPWELL are increased to Vs from Vx after the potential difference between the selection bit line BLe, and the non-selection bit line BLo, the cell source CELSRC and the cell well CPWELL is set to 0.7V (VBL) while using the power supply potential.

At this time, since BLCE is VSS, the selection bit line BLe is in the floating state.

Most of capacitance generated in the selection bit line BLe is parasitic capacitance between the selection bit line BLe and the non-selection bit line BLo adjacent thereto, and part of the remaining capacitance is parasitic capacitance between the cell source CELSRC and the cell well CPWELL.

For this reason, when increasing the non-selection bit line BLo, the cell source CELSRC and the cell well CPWELL to Vs from Vx, due to the capacitance coupling, the selection bit line BLe results in VBL+Vx+(Vs−Vx)=VBL+Vs.

Thus, if providing VREAD to SGS after the selection bit line BLe is charged to Vs+VBL, when the selection cell is ON, the cell current flows, and the selection bit line BLe approaches Vs. In addition, when the selection cell is OFF, the cell current does not flow, and thus the selection bit line maintains the pre-charge potential (Vs+VBL).

Next, when decreasing the potential of the non-selection bit line BLo, the cell source CELSRC and the cell well CPWELL to Vx from Vs, the potential of the selection bit line BLe approaches Vx when the selection cell is ON, while when the selection cell is OFF, the potential of the selection bit line BLe is kept to be VBL+Vx, due to the capacitance coupling.

After that, HHLE is raised, SEN0 is subjected to the pre-charge to VDD, CLK is raised, and the connection node SEN0 is made to increase to about 4.5V due to the capacitance coupling, and subsequently, BLCE is set to VSEN (=0.5V)+Vth+Vx.

The level of the connection node SEN0 in the capacitance of the connection node SEN becomes equal to the level of the selection bit line BLe when the level of the selection bit line BLe is lower than 0.5V+Vx due to ON cell. In addition, when the level of the selection bit line BLe is about (0.7V+Vx) by OFF cell, the connection node SEN0 is kept to be 4.5V.

When lowering down CLK under the state that XXLE is set to about 1.2V, the potential of the connection node SEN0 decreases due to the capacitance coupling. The connection node SEN0 connected to ON cell lowers in the vicinity of 0V, while the connection node SEN0 connected to OFF cell lowers in the vicinity of VDD.

Then, RSTE is raised, STRB is lowered down, and "H"/"L" is discriminated with the latch circuit LAT0 in the sense amplifier S/A.

According to such sense operation, also in the ABL system, by making the non-selection bit line BLo, the cell source CELSRC and the cell well CPWELL ascend or descend with two stages (0V→Vx→Vs, Vs→Vx→0V), it is possible to decrease variations of the potential of the selection bit line BLe caused by the capacitance coupling. In addition, it is possible to realize the negative potential read without modifying the device or increasing the chip area.

Meanwhile, it is desirable for Vx, Vs to possess characteristics to compensate temperature dependency of the threshold voltage of the cell transistor.

(4) Summary

As described in the above embodiments, according to the present invention, it is possible to provide the bias for the negative potential read to the bit line even if there is no booster, based on the operation technique utilizing the capacitance coupling generated in the bit line.

In addition, it is also possible to eliminate variations of the bit line bias caused by utilizing only the capacitance coupling when fixing the bias to a constant value by using the booster supplementarily.

3. Application Example

There will be described an example of a system to which the nonvolatile semiconductor memory device of the present invention is applied.

Figure 22:
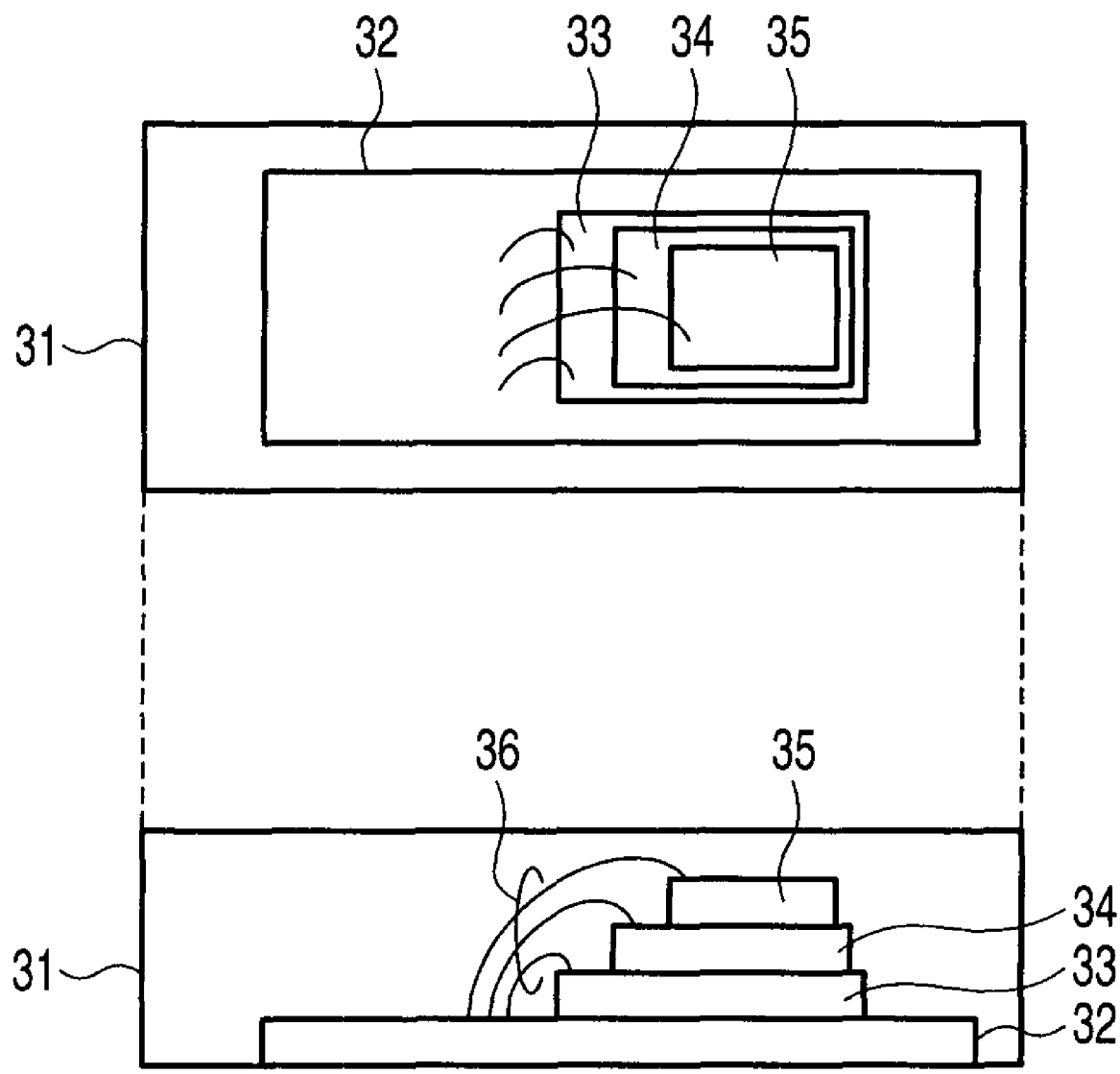
FIG. 22 is a view showing a system as an application example.

FIG. 22 shows one example of a memory system.

This system is, for instance, a memory card, a USB memory or the like.

A circuit substrate 32, and a plurality of semiconductor chips 33, 34 and 35 are arranged in a package 31. The circuit substrate 32 and the plurality of semiconductor chips 33, 34 and 35 are electrically connected by a bonding wire 36. One of the semiconductor chips 33, 34 and 35 is the nonvolatile semiconductor memory device according to the present invention.

Figure 23:
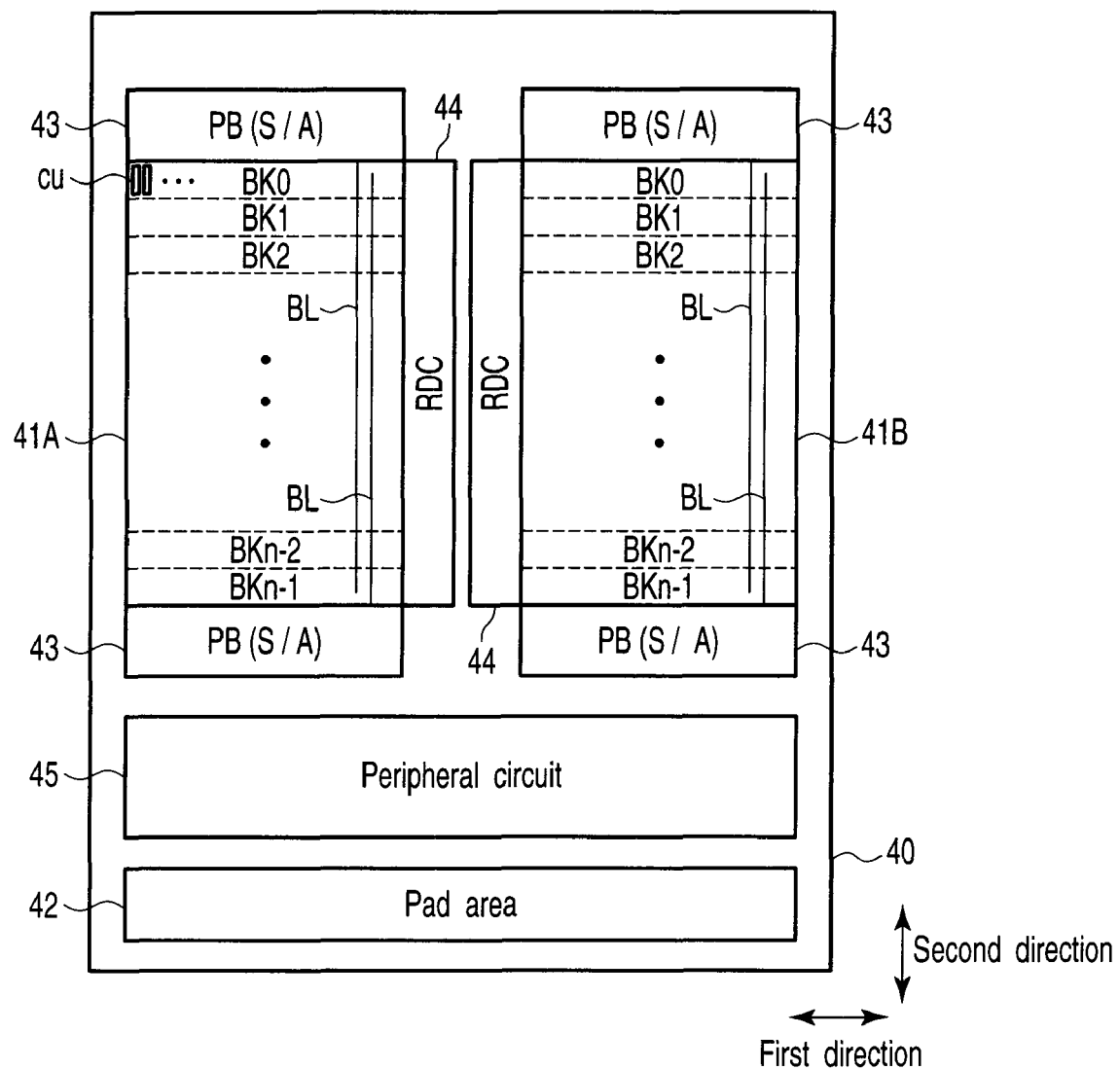
FIG. 23 is a view showing a chip layout as an application example.

FIG. 23 shows a chip layout of the nonvolatile semiconductor memory device.

Memory cell arrays 41A, 41B are arranged on a semiconductor chip 40. Each of the memory cell arrays 41A, 41B has a block BK0, BK1, . . . BKn−1 arranged in the second direction. Each of the blocks BK0, BK1, . . . BKn−1 has a plurality of cell units CU arranged in the first direction.

The cell unit CU is, for instance, a NAND cell unit.

The bit line BL extending in the second direction is arranged on each of the memory cell arrays 41A, 41B. A page buffer (PB) 43 is arranged at both ends of the memory cell arrays 41A, 41B in the second direction. The page buffer 43 has a function to store read data/write data temporarily at the time of read/write. In addition, the page buffer 43 functions as the sense amplifier (S/A) at the time of read or at the time of verification of write/erase operation.

A row decoder (RDC) 44 is arranged at one end (opposite side end to an edge side end of a semiconductor chip 40) of the memory cell arrays 41A, 41B in the first direction. In addition, a pad area 42 is arranged along an edge of the semiconductor chip 40, at one end side of the memory cell arrays 41A, 41B in the second direction. A peripheral circuit 45 is arranged between the page buffer 43 and the pad area 42.

4. Conclusion

According to the present invention, it is possible to realize read (including verify read) system for discriminating the plurality of threshold distributions existing in the negative region without modification of the device or increase in the chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
a semiconductor region;
first and second cell units formed in the semiconductor region;
a first bit line connected to one end of the first cell unit;
a second bit line connected to one end of the second cell unit;
a source line connected to the other ends of the first and second cell units; and
a control circuit which controls the semiconductor region, the first and second bit lines, and the source line,
wherein the first cell unit is comprised of:
a first cell transistor having a charge storage layer and a control gate electrode;
a first select gate transistor connected between the first cell transistor and the first bit line; and
a second select gate transistor connected between the first cell transistor and the source line,
wherein the second cell unit is comprised of:
a second cell transistor having a charge storage layer and a control gate electrode;
a third select gate transistor connected between the second cell transistor and the second bit line; and
a fourth select gate transistor connected between the second cell transistor and the source line, and
wherein the control circuit is comprised of:
first means for making the first bit line floating, after precharging the first bit line to a first potential;
second means for varying the first bit line from the first potential to a third potential by providing a second potential to the second bit line, the semiconductor region and the source line with the first bit line in the floating state; and
third means for reading data of the first cell transistor to the first bit line, after setting the first bit line to the third potential.

2. The nonvolatile semiconductor memory device according to claim 1,
wherein the control circuit has fourth means for setting the first bit line to a fourth potential forcibly, after setting the first bit line to the third potential, and
the data of the first cell transistor is read to the first bit line, after setting the first bit line to the fourth potential.

3. The nonvolatile semiconductor memory device according to claim 1, further comprising a sense amplifier connected to the first bit line,
wherein the control circuit has means for setting the second bit line, the semiconductor region and the source line to a potential lower than the second potential, after reading the data of the first cell transistor to the first bit line, and
a sense operation of the sense amplifier is executed, after setting the second bit line, the semiconductor region and the source line to a potential lower than the second potential.

4. The nonvolatile semiconductor memory device according to claim 1, further comprising:
a sense amplifier connected to the first bit line; and
a level conversion circuit comprised of a capacitor, whose one end is connected to a connection node of the first bit line and the sense amplifier,
wherein the level conversion circuit lowers a potential of the other end of the capacitor after the data read to the first bit line is transferred to the connection node.

5. The nonvolatile semiconductor memory device according to claim 1,
wherein the first cell transistor is a multi-level memory cell which stores n-level (n is a natural number more than 3), and at least two levels of the n-level have a threshold value in a negative region.

6. The nonvolatile semiconductor memory device according to claim 5,
wherein when discriminating at least two levels existing in the negative region, the control gate electrode of the first cell transistor is set to a positive potential.

7. The nonvolatile semiconductor memory device according to claim 1,
wherein when reading the data of the first cell transistor to the first bit line, the second bit line functions as a shield bit line.

8. The nonvolatile semiconductor memory device according to claim 1,
wherein the second potential is supplied to the second bit line, the semiconductor region and the source line from one potential control circuit.

9. The nonvolatile semiconductor memory device according to claim 1,
wherein the second bit line, the semiconductor region and the source line are set to the second potential higher than a plus potential, after being set to the plus potential from a ground potential.

10. The nonvolatile semiconductor memory device according to claim 1,
wherein the second and fourth select gate transistors change from OFF to ON after the first bit line results in the third potential.

11. The nonvolatile semiconductor memory device according to claim 3,
wherein the second and fourth select gate transistors change from OFF to ON, after the second bit line, the semiconductor region and the source line result in a potential lower than the second potential, before the sense operation of the sense amplifier.

12. A nonvolatile semiconductor memory device comprising:
a semiconductor region;
first and second cell units formed in the semiconductor region;
a first bit line connected to one end of the first cell unit;
a second bit line connected to one end of the second cell unit;
a source line connected to the other ends of the first and second cell units; and
a control circuit which controls the semiconductor region, the first and second bit lines, and the source line,
wherein the first cell unit is comprised of:
a first cell transistor having a charge storage layer and a control gate electrode;
a first select gate transistor connected between the first cell transistor and the first bit line; and
a second select gate transistor connected between the first cell transistor and the source line,
wherein the second cell unit is comprised of:
a second cell transistor having a charge storage layer and a control gate electrode;
a third select gate transistor connected between the second cell transistor and the second bit line; and
a fourth select gate transistor connected between the second cell transistor and the source line, and
wherein the control circuit is comprised of:
first means for making the first bit line floating, after precharging the first bit line to a first potential;
second means for varying the first bit line from the first potential to a third potential by providing a second potential to the second bit line with the first bit line in the floating state; and
third means for reading data of the first cell transistor to the first bit line, after setting the first bit line to the third potential.

13. The nonvolatile semiconductor memory device according to claim 12,
wherein the control circuit has fourth means for setting the first bit line to a fourth potential forcibly, after setting the first bit line to the third potential, and
the data of the first cell transistor is read to the first bit line, after setting the first bit line to the fourth potential.

14. The nonvolatile semiconductor memory device according to claim 12, further comprising a sense amplifier connected to the first bit line,
wherein the control circuit has means for setting the second bit line to a potential lower than the second potential, after reading the data of the first cell transistor to the first bit line, and
a sense operation of the sense amplifier is executed, after setting the second bit line to a potential lower than the second potential.

15. The nonvolatile semiconductor memory device according to claim 12, further comprising:
a sense amplifier connected to the first bit line; and
a level conversion circuit comprised of a capacitor, whose one end is connected to a connection node of the first bit line and the sense amplifier,
wherein the level conversion circuit lowers a potential of the other end of the capacitor after the data read to the first bit line is transferred to the connection node.

16. The nonvolatile semiconductor memory device according to claim 12,
wherein the first cell transistor is a multi-level memory cell which stores n-level (n is a natural number more than 3), and at least two levels of the n-level have a threshold value in a negative region.

17. The nonvolatile semiconductor memory device according to claim 16,
wherein when discriminating at least two levels existing in the negative region, the control gate electrode of the first cell transistor is set to a positive potential.

18. The nonvolatile semiconductor memory device according to claim 12,
wherein when reading the data of the first cell transistor to the first bit line, the second bit line functions as a shield bit line.

19. The nonvolatile semiconductor memory device according to claim 12,
wherein the second potential is supplied to the second bit line from a bit line potential control circuit.

20. The nonvolatile semiconductor memory device according to claim 12, wherein the second bit line is set to the second potential higher than a plus potential, after being set to the plus potential from a ground potential.

21. The nonvolatile semiconductor memory device according to claim 12, wherein the second and fourth select gate transistors change from OFF to ON after the first bit line results in the third potential.

22. The nonvolatile semiconductor memory device according to claim 14, wherein the second and fourth select gate transistors change from OFF to ON, after the second bit line, the semiconductor region and the source line result in a potential lower than the second potential, before the sense operation of the sense amplifier.

* * * * *